(12) United States Patent
Chang

(10) Patent No.: US 12,394,643 B2
(45) Date of Patent: Aug. 19, 2025

(54) APPARATUS FOR MANUFACTURING A BONDED SEMICONDUCTOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventor: Jen-Yuan Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 515 days.

(21) Appl. No.: 17/817,088

(22) Filed: Aug. 3, 2022

(65) Prior Publication Data
US 2024/0047242 A1    Feb. 8, 2024

(51) Int. Cl.
*H01L 21/67* (2006.01)
*H01L 21/677* (2006.01)
*H01L 23/00* (2006.01)

(52) U.S. Cl.
CPC .. *H01L 21/67144* (2013.01); *H01L 21/67703* (2013.01); *H01L 24/80* (2013.01); *H01L 2224/80895* (2013.01); *H01L 2224/80896* (2013.01)

(58) Field of Classification Search
CPC ......... H01L 21/67703; H01L 21/67144; H01L 24/80; H01L 24/67207
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2021/0141014 A1* | 5/2021 | Kwon ................ G01R 31/2894 |

* cited by examiner

*Primary Examiner* — Joshua Benitez Rosario
*Assistant Examiner* — Jacob T Nelson
(74) *Attorney, Agent, or Firm* — WPAT LAW; Anthony King

(57) ABSTRACT

An apparatus for manufacturing a bonded semiconductor structure includes a wafer processing unit including a first and second bonding chambers; a wafer transfer module including a first chamber coupled to the first and second bonding chambers, wherein the wafer transfer module is configured to transport a wafer within the first chamber and into and out of the wafer processing unit; a die transfer module including a second chamber coupled to the first and second bonding chambers, wherein the die transfer module is configured to transport a die carrier within the second chamber and into and out of the wafer processing unit; and a control system configured to control conditions of the first bonding chamber, the second bonding chamber, the first chamber and the second chamber. The first bonding chamber, the second bonding chamber, the first chamber and the second chamber are under same conditions controlled by the control system.

20 Claims, 20 Drawing Sheets

APPARATUS FOR MANUFACTURING A BONDED SEMICONDUCTOR STRUCTURE AND METHOD FOR MANUFACTURING THE SAME

BACKGROUND

The semiconductor industry has experienced rapid growth due to ongoing improvements in integration density of a variety of components. As semiconductor technologies further advance, stacked and bonded semiconductor devices have emerged as an effective alternative to further reduce a physical size of a semiconductor device. In the stacked semiconductor device, active circuits such as logic, memory, processor circuits and the like are fabricated at least partially on separate substrates and then physically and electrically bonded together in order to form a functional device. Such bonding processes utilize sophisticated techniques, and need to be performed efficiently in a suitable environment.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
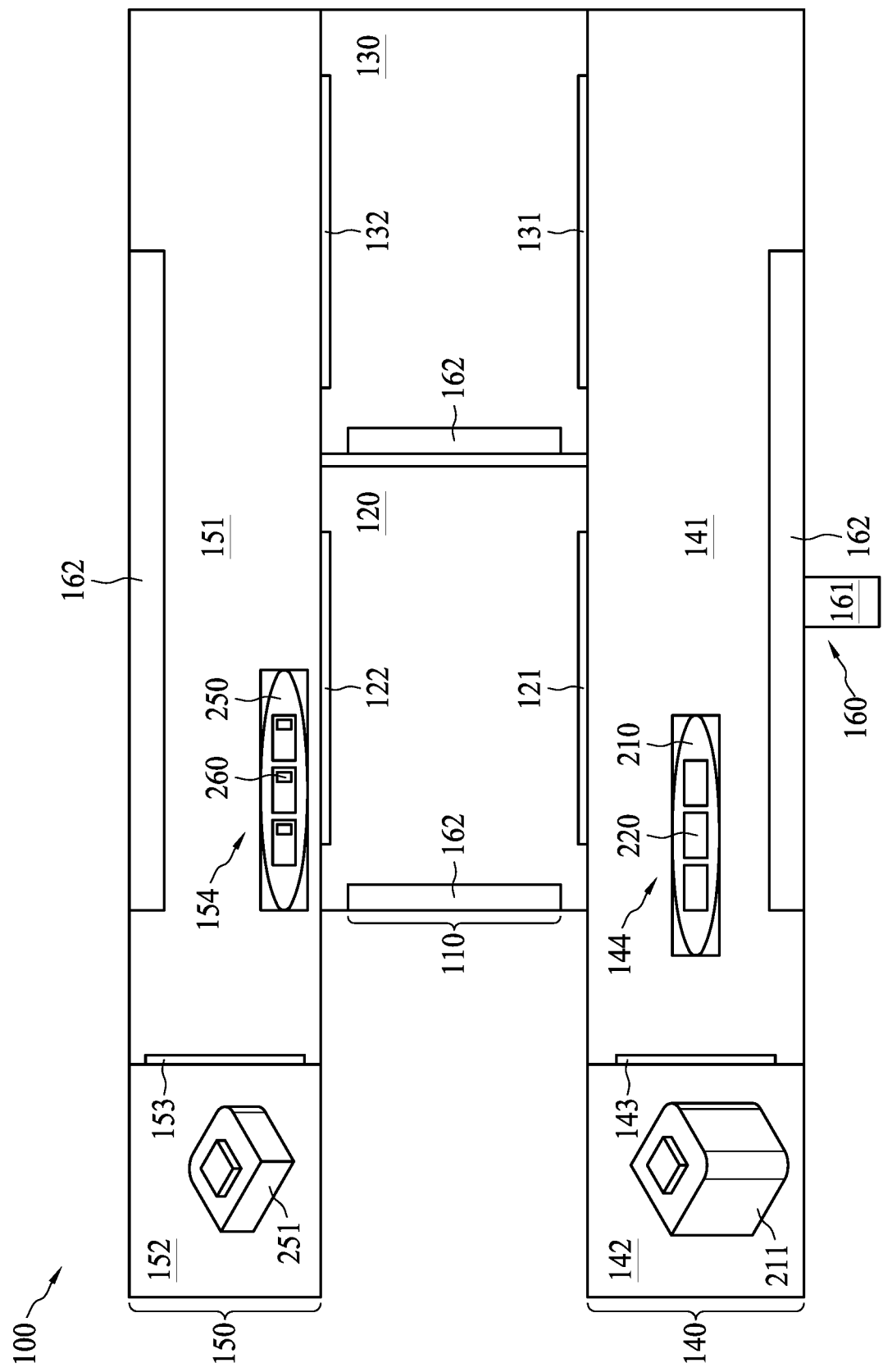
FIG. 1 is a schematic view of an apparatus for manufacturing a bonded semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the normal deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of 3D packaging or 3DIC devices. The testing structures may include, for example, test pads formed in a redistribution layer or on a substrate that allows the testing of the 3D packaging or the 3DIC devices, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

As the complexity of electronic devices has grown, a need for faster and more creative packaging techniques of semiconductor structures has emerged. Along with the advantages from geometry size reductions, improvements to the apparatus used to manufacture and produce bonded semiconductor structure are needed.

A bonded semiconductor structure, including a plurality of components having different functions, is produced by a plurality of processes in an integrated circuit fabrication facility. During the fabrication stages, wafers or semiconductor substrates are transported within the fabrication facility and between fabrication tools. For example, typically, after a processing step, the wafer is removed from a process chamber that performed the processing step and the wafer is transferred to a holder where the wafer is temporarily stored until a subsequent processing step. During the transporting of the wafer in the holder, the wafer is exposed to the surrounding environment, including undesired elements, such as moisture, oxygen, particles and total volatile organic compound (TVOC) contamination. Such exposure causes a decrease in Q-time (e.g., the maximum allowable time between semiconductor processes), and prevents the bonded semiconductor structure from being processed within the production deadlines limited by the decreased Q-time.

Accordingly, an apparatus and a method for providing a protective, controlled environment for manufacturing a bonded semiconductor structure is needed.

FIG. 1 is a schematic view of an apparatus 100 for manufacturing a bonded semiconductor structure in accordance with some embodiments of the present disclosure. Referring to FIG. 1, the apparatus 100 for manufacturing the bonded semiconductor structure includes a wafer processing unit 110, a wafer transfer module 140, a die transfer module 150 separated from the wafer transfer module 140, and a control system 160.

In some embodiments, the wafer processing unit 110 is configured to process a wafer, such as bonding a die 260 to a wafer 210. In some embodiments, the wafer processing unit 110 includes a first bonding chamber 120 and a second bonding chamber 130 separated from the first bonding chamber 120. In some embodiments, the first bonding chamber 120 is a hybrid bonding chamber, and the second bonding chamber 130 is a fusion bonding chamber.

In some embodiments, the wafer transfer module 140 includes a first chamber 141 coupled to the first bonding chamber 120 and the second bonding chamber 130. In some embodiments, the wafer transfer module 140 is configured to transport the wafer 210 within the first chamber 141 and transport the wafer 210 into and out of the wafer processing unit 110. In some embodiments, the wafer transfer module 140 is configured to transport a wafer 210 within the first chamber 141 and transport the wafer 210 into and out of the first bonding chamber 120 and the second bonding chamber 130.

In some embodiments, the wafer transfer module 140 further includes a first wafer load port 142, wherein the first wafer load port 142 is coupled to the first chamber 141 and configured to load the wafer 210 into, or unload the wafer from, the first chamber 141. In some embodiments, a slit door 143 is disposed between the first chamber 141 and the first wafer load port 142, wherein the slit door 143 is in communication with the wafer load port 142 and the first chamber 141.

In some embodiments, the wafer transfer module 140 further includes a wafer transfer device 144 configured to carry the wafer 210 and transfer the wafer 210 into and out of the first bonding chamber 120, and into and out of the second bonding chamber 130. In some embodiments, the wafer transfer device 144 is a cart. The wafer transfer device 144 may transport one or more wafers 210 at a time.

In some embodiments, the die transfer module 150 includes a second chamber 151 coupled to the first bonding chamber 120 and the second bonding chamber 130. In some embodiments, the die transfer module 150 is configured to transport a die carrier 250 within the second chamber 151, and transport the die carrier 250 into and out of the wafer processing unit 110. In some embodiments, the die carrier 250 carries the die 260. In some embodiments, the die carrier 250 carries a plurality of dies 260. In some embodiments, the die transfer module 150 is configured to transport the dies 260 into and out of the first bonding chamber 120 and the second bonding chamber 130. In some embodiments, the die carrier 250 is a frame.

In some embodiments, the die transfer module 150 further includes a first cassette load port 152 coupled to the second chamber 151, wherein the first cassette load port 152 is configured to load the die carrier 250 into, or unload the die carrier 250 from, the second chamber 151. In some embodiments, a slit door 153 is disposed between the second chamber 151 and the first cassette load port 152, wherein the slit door 153 is in communication with the first cassette load port 152 and the second chamber 151.

In some embodiments, the die transfer module 150 further includes a frame transfer device 154 configured to transfer the die carrier 250 within the second chamber 151, into and out of the first bonding chamber 120, and into and out of the second bonding chamber 130. In some embodiments, the frame transfer device 154 is a cart. The frame transfer device 154 may transport one or more die carriers 250 at a time.

In some embodiments, the first bonding chamber 120 includes a first slit door 121 in communication with the first chamber 141 of the wafer transfer module 140 and a second slit door 122 in communication with the second chamber 151 of the die transfer module 150. In some embodiments, the first slit door 121 is configured to transport the wafer 210 into and out of the first bonding chamber 120. In some embodiments, the second slit door 122 is configured to transport the die carrier 250 into and out of the first bonding chamber 120.

In some embodiments, the second bonding chamber 130 includes a third slit door 131 in communication with the first chamber 141 of the wafer transfer module 140 and a fourth slit door 132 in communication with the second chamber 151 of the die transfer module 150. In some embodiments, the third slit door 131 is configured to transport the wafer 210 into and out of the second bonding chamber 130. In some embodiments, the fourth slit door 132 is configured to transport the die carrier 250 into and out of the second bonding chamber 130.

In some embodiments, the control system 160 is configured to control environmental conditions of the first bonding chamber 120, the second bonding chamber 130, the first chamber 141 and the second chamber 151. In some embodiments, the environmental conditions such as temperature, humidity, air flow rate, pressure, amount of total volatile organic compound, and amount of particles in the first bonding chamber 120, the second bonding chamber 130, the first chamber 141 and the second chamber 151 are adjusted by the control system 160. In some embodiments, the control system 160 includes a central processor 161 and a plurality of environmental controllers 162 disposed throughout the apparatus 100 and electrically connected to the central processor 161. In some embodiments, the central processor 161 provides an instruction to the environmental controllers 162, and the environmental controllers 162 adjust the environmental conditions in accordance with the instruction.

The number and location of the plurality of environmental controllers 162 are not particularly limited. For example, the environmental controllers 162 can be arranged anywhere in the first chamber 141 and spaced apart from each other, anywhere in the second chamber 151 and spaced apart from each other, anywhere in the first bonding chamber 120 and spaced apart from each other, and anywhere in the second bonding chamber 130 and spaced apart from each other; however, the present invention is not limited thereto. In some embodiments, the environmental controllers 162 are further disposed in the first wafer load port 142 and the first cassette load port 152. In some embodiments, the first bonding chamber 120, the second bonding chamber 130, the first chamber 141 and the second chamber 151 are under same environmental conditions controlled by the control system 160. In some embodiments, the first chamber 141 and the first wafer load port 142 are under same environmental conditions controlled by the control system 160. In some embodiments, the second chamber 151 and the first cassette load port 152 are under same environmental conditions controlled by the control system 160.

The environmental controllers 162 are not limited to any particular type, as long as they can control the environmental conditions after receiving the instruction from the central processor 161. The environmental controllers 162 change the environmental conditions, so as to adjust the temperature, humidity, air flow rate, pressure, amount of total volatile organic compound and amount of particles throughout the apparatus 100, so that the bonded semiconductor structure thus obtained has desired predetermined yield. In some embodiments, each of the environmental controllers 162 includes a gas conduit, a temperature regulator, a humidifier and an air purifier.

Figure 2:
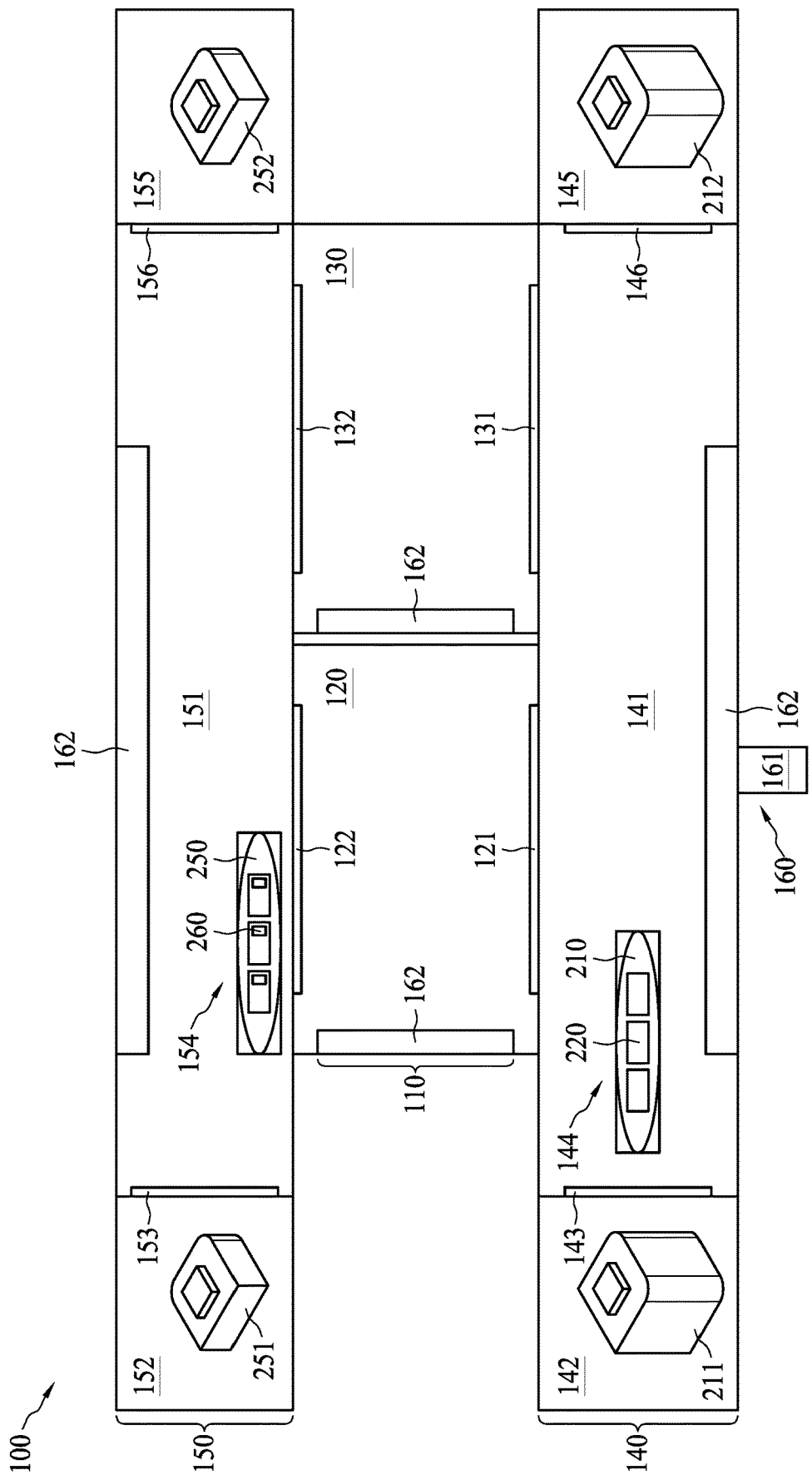
FIG. 2 is a schematic view of an apparatus for manufacturing a bonded semiconductor structure in accordance with some embodiments of the present disclosure.

FIG. 2 is a schematic view of the apparatus 100 for manufacturing a bonded semiconductor structure in accordance with some embodiments of the present disclosure. In some embodiments, referring to FIG. 2, the wafer transfer module 140 further includes a second wafer load port 145 coupled to the first chamber 141 and configured to load the wafer 210 into, or unload the wafer 210 from, the first chamber 141. The second wafer load port 145 is separate from the first wafer load port 142. In some embodiments, the first wafer load port 142 is configured to load the wafer 210 into the wafer transfer module 140 and the second wafer load port 145 is configured to unload the wafer 210 from the wafer transfer module 140. In some embodiments, the second wafer load port 145 is configured to load the wafer 210 into the wafer transfer module 140 and the first wafer load port 142 is configured to unload the wafer 210 out of the wafer transfer module 140. In some embodiments, the first wafer load port 142 and the second wafer load port 145 are disposed at the two opposite sides of the first chamber 141.

In some embodiments, a slit door 146 is disposed between the first chamber 141 and the second wafer load port 145, and is in communication with the first chamber 141 and the second wafer load port 145. In some embodiments, the second wafer load port 145 and the first chamber 141 are under same environmental conditions controlled by the control system 160.

In some embodiments, the die transfer module 150 further includes a second cassette load port 155 coupled to the second chamber 151 and configured to load the die carrier 250 into, or unload the die carrier from, the second chamber 151. The second cassette load port 155 is separate from the first cassette load port 152. In some embodiments, the first cassette load port 152 is configured to load the die carrier 250 into the die transfer module 150, and the second cassette load port 155 is configured to unload the die carrier 250 from the die transfer module 150. In some embodiments, the second cassette load port 155 is configured to load the die carrier 250 into the die transfer module 150, and the first cassette load port 152 is configured to unload the die carrier 250 out of the die transfer module 150. In some embodiments, the first cassette load port 152 and the second cassette load port 155 are disposed at the two opposite sides of the second chamber 151.

In some embodiments, a slit door 156 is disposed between the second chamber 151 and the second cassette load port 155, and is in communication with the second chamber 151 and the second cassette load port 155. In some embodiments, the second cassette load port 155 and the second chamber 151 are under same environmental conditions controlled by the control system 160.

Figure 3:
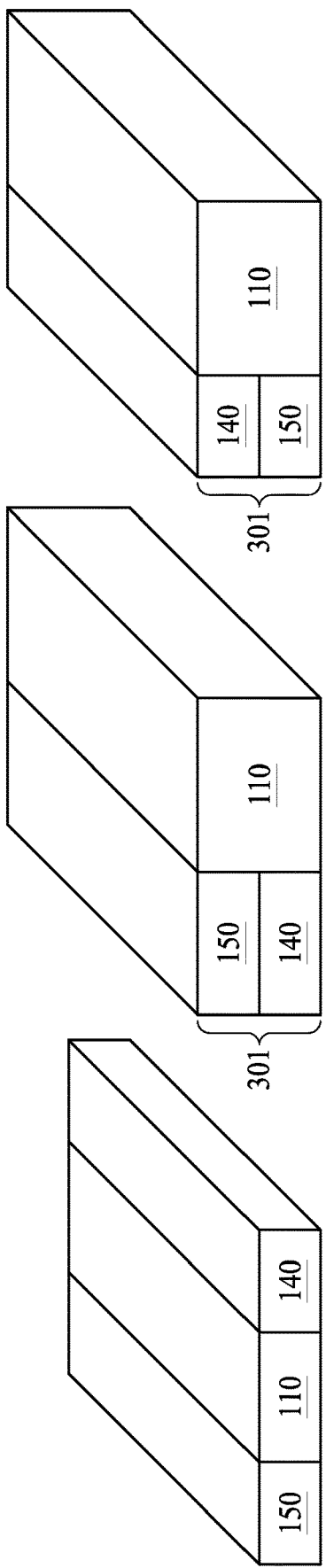
FIGS. 3A to 3C are schematic views of an apparatus for manufacturing a bonded semiconductor structure in accordance with some embodiments of the present disclosure.

FIGS. 3A to 3C are schematic views of an apparatus for manufacturing a bonded semiconductor structure in accordance with some embodiments of the present disclosure. In some embodiments, the wafer transfer module 140 and the die transfer module 150 are disposed adjacent to the wafer processing unit 110. In some embodiments, the wafer transfer module 140 and the die transfer module 150 are in contact with the wafer processing unit 110. In some embodiments, referring to FIGS. 1, 2 and 3A, the wafer processing unit 110 is disposed between the wafer transfer module 140 and the die transfer module 150. In some embodiments, the wafer transfer module 140 and the die transfer module 150 are disposed on two opposite sides of the wafer processing unit 110.

In some embodiments, referring to FIG. 3B, the die transfer module 150 is disposed over the wafer transfer module 140, the wafer transfer module 140 and the die transfer module 150 form a stack 301, and the stack 301 is disposed adjacent to the wafer processing unit 110. In some embodiments, the die transfer module 150 and the wafer transfer module 140 of the stack 301 are in contact with the wafer processing unit 110. In some embodiments, referring to FIG. 3C, the stack 301 includes the wafer transfer module 140 disposed over the die transfer module 150.

Figure 4:
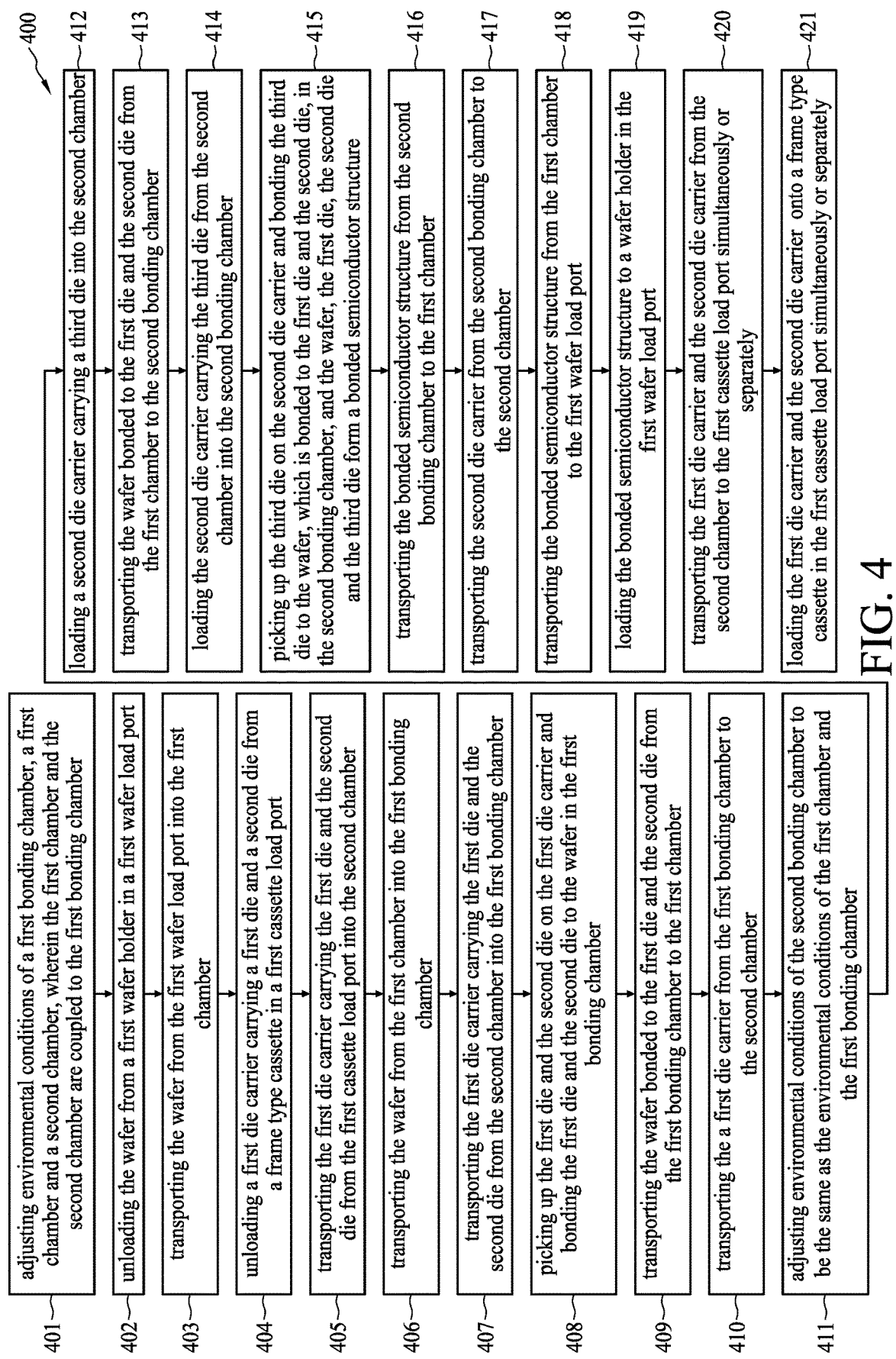
FIG. 4 illustrates a flowchart of a method for manufacturing a bonded semiconductor structure, in accordance with some embodiments of the present disclosure.

FIG. 4 illustrates a flowchart of a method 400 for manufacturing a bonded semiconductor structure, in accordance with some embodiments. Additional steps can be provided before, during, and after the steps shown in FIG. 4, and some of the steps described below can be replaced or eliminated in other embodiments of the method 400. The order of the steps may be interchangeable. FIGS. 5 to 14 are schematic views illustrating exemplary operations for the method of manufacturing a bonded semiconductor structure, e.g., illustrated in FIG. 4, according to one embodiment of the present disclosure.

Figure 5:
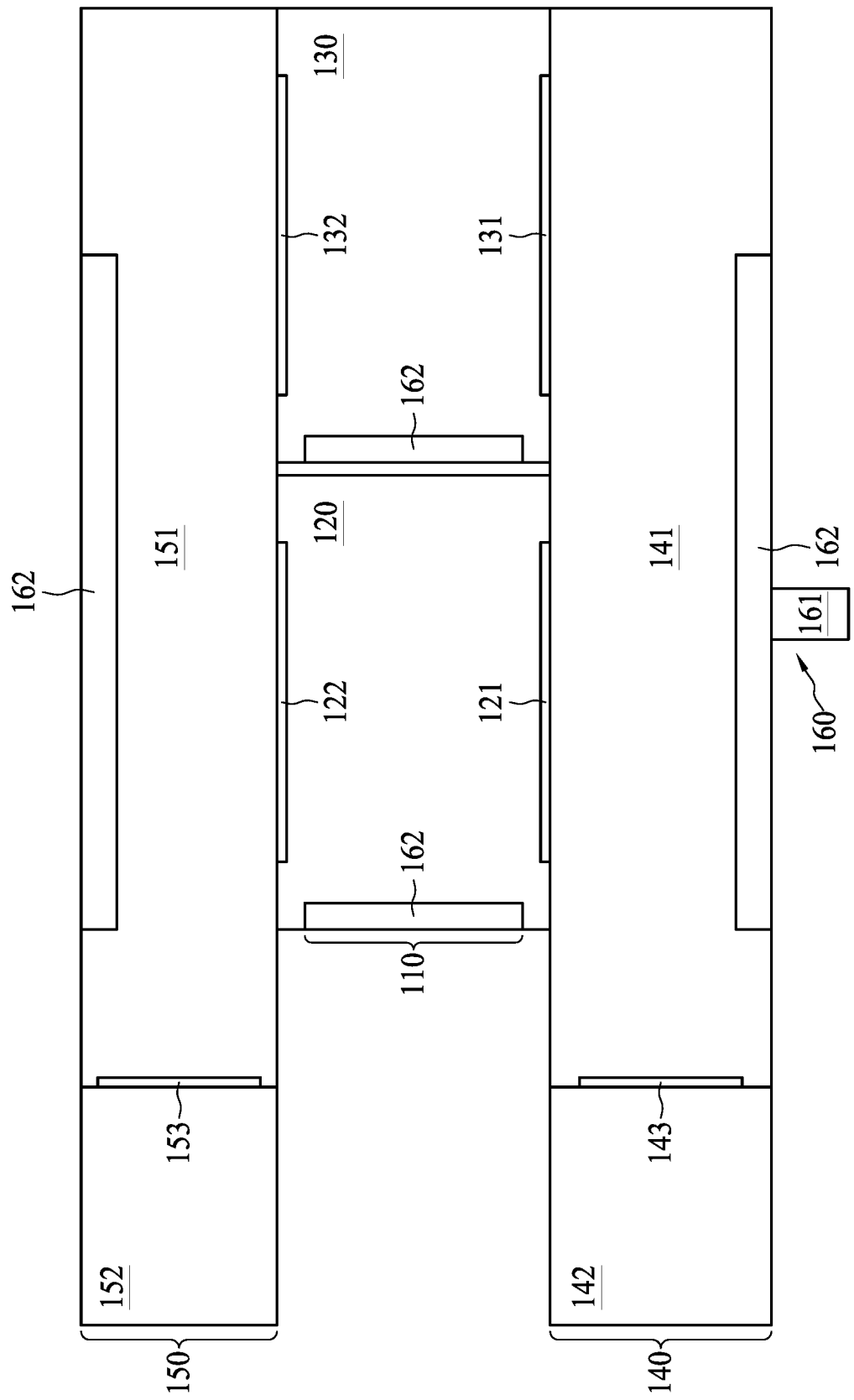
FIGS. 5 to 14 are schematic views illustrating exemplary operations in a method for manufacturing a bonded semiconductor structure, in accordance with some embodiments of the present disclosure.

Referring to FIGS. 4 and 5, in some embodiments, in step 401, environmental conditions of a first bonding chamber 120, a first chamber 141 and a second chamber 151 of an apparatus 100 are adjusted, wherein the first chamber 141 and the second chamber 151 are coupled to the first bonding chamber 120. In some embodiments, the environmental conditions of the first chamber 141, the first bonding chamber 120 and the second chamber 151 are adjusted by a control system 160 including a central processor 161 and a plurality of environmental controllers 162 disposed throughout the apparatus 100 and electrically connected to the central processor 161. In some embodiments, the central processor 161 instructs the plurality of environmental controllers 162 disposed in the first chamber 141, the first bonding chamber 120 and the second chamber 151 to control and adjust the environmental conditions. In some embodiments, the environmental controllers 162 control the temperature, humidity, air flow rate, pressure, amount of total volatile organic compound, and amounts of particles of the first chamber 141, the first bonding chamber 120 and the second chamber 151.

In some embodiments, a temperature of the first chamber 141 ranges between and 100° C., and preferably ranges between 20° C. and 40° C. In some embodiments, the humidity of the first chamber 141 ranges between 1% and 100%, and preferably ranges between 20% and 60%. In some embodiments, the air flow rate of the first chamber 141 ranges between 0 and 100 m$^2$/sec, and is preferably less than 1 m$^2$/sec. In some embodiments, the pressure of the first chamber 141 ranges between 0.01 and 10 atm, and preferably ranges between 0.1 and 1 atm. In some embodiments, an amount of particles in the first chamber 141 ranges between class 0 and 1000, preferably less than class 3. In some embodiments, an amount of total volatile organic compound of the first chamber 141 ranges between 0 and 1000 ppm, and is preferably less than 0.01 ppm.

In some embodiments, the first bonding chamber 120, the second bonding chamber 130, the first chamber 141 and the second chamber 151 are under same environmental conditions controlled by the control system 160.

Figure 6:
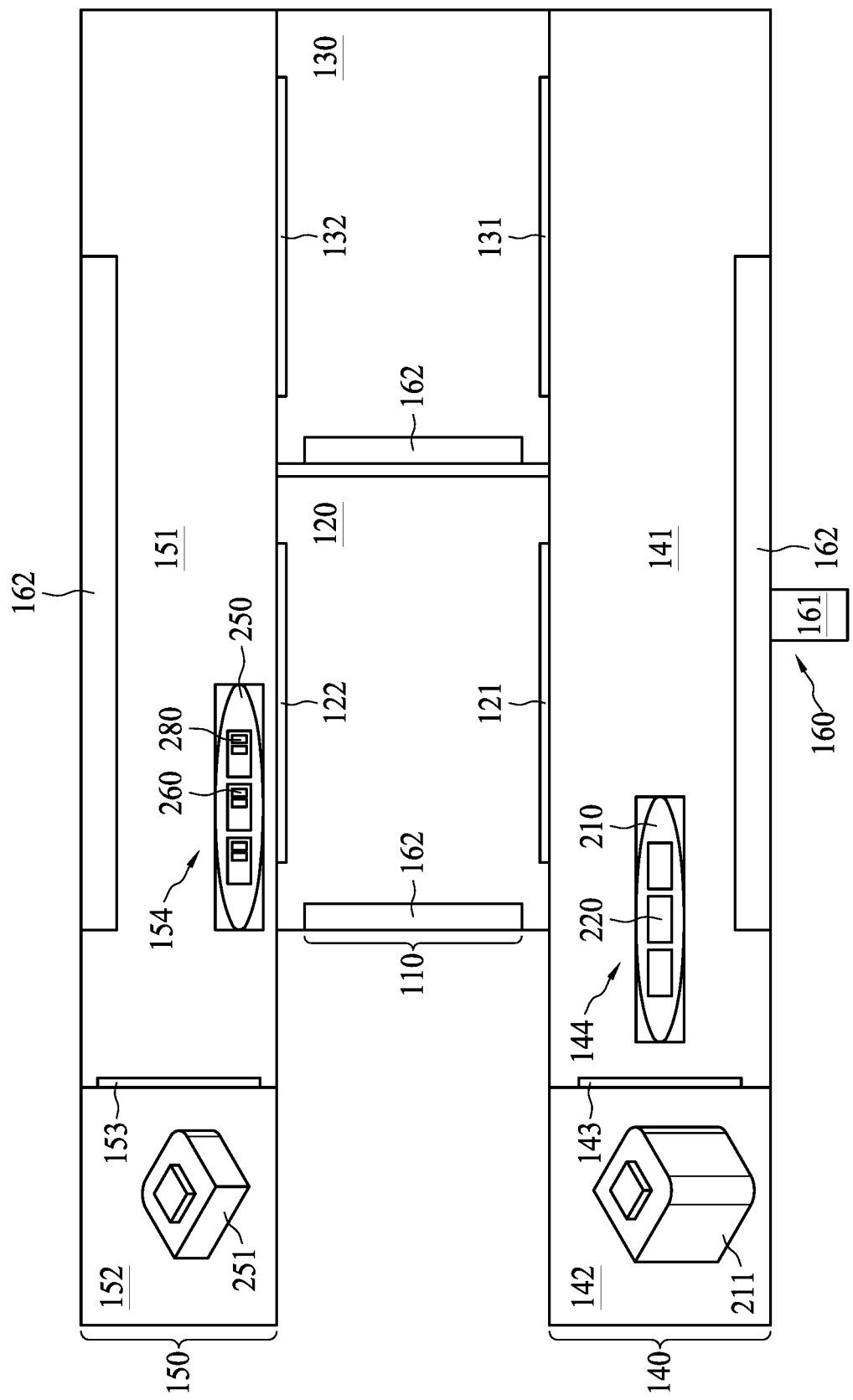

Referring to FIGS. 4 and 6, in some embodiments, in step 402, a wafer 210 is unloaded from a wafer holder 211 in a first wafer load port 142 coupled to the first chamber 141. In some embodiments, the wafer 210 is loaded into a wafer transfer module 140. In some embodiments, environmental conditions of the first wafer load port 142 are controlled and adjusted by the control system 160. In some embodiments, the first chamber 141 and the first wafer load port 142 are under same environmental conditions controlled by the control system 160.

In some embodiments, the wafer 210 is a silicon wafer. In some embodiments, the wafer 210 includes a semiconductor substrate area 220. In some embodiments, the semiconductor substrate area 220 is a bulk semiconductor, a semiconductor-on-insulator (SOI) substrate, or the like, and may be doped (e.g., with a p-type or n-type dopant) or undoped. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the semiconductor substrate area 220 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the wafer 210 includes a plurality of semiconductor substrates 220.

In some embodiments, the wafer holders 211 may be a wafer cassette, a front opening unified pod (FOUP) or front opening shipping box (FOSB). In some embodiments, each of the wafer holders 211 is airtight. In some embodiments, a plurality of wafers 210 are disposed in the wafer holder 211. The wafers 210 may have similar structures or different structures in order to meet desired functional requirements.

In some embodiments, in step 403, the wafer 210 is transported from the first wafer load port 142 into the first chamber 141. In some embodiments, a wafer transfer device 144 carries the wafer 210. In some embodiments, a slit door 143 between the first chamber 141 and the first wafer load port 142 is opened, and the wafer 210 carried by the wafer transfer device 144 is loaded into the first chamber 141. In some embodiments, after the wafer 210 is loaded into the first chamber 141, the slit door 143 is closed.

In some embodiments, in step 404, a first die carrier 250 carrying a first die 260 and a second die 280 is unloaded from a frame type cassette 251 in a first cassette load port 152 coupled to the second chamber 151. In some embodiments, the first die carrier 250 carrying the first die 260 and the second die 280 is loaded into a die transfer module 150. In some embodiments, the first die carrier 250 carries only the first die 260. In some embodiments, environmental conditions of the first cassette load port 152 are controlled and adjusted by the control system 160. In some embodiments, the second chamber 151 and the first cassette load port 152 are under same environmental conditions controlled by the control system 160.

In some embodiments, the frame type cassette 251 may be a frame cassette, a front opening unified pod (FOUP) or front opening shipping box (FOSB). In some embodiments, each of the frame type cassettes 251 is airtight. In some embodiments, a plurality of die carriers are unloaded from the frame type cassette 251, such as the first die carrier 250 and a second die carrier (not shown). In some embodiments, the first die carrier 250 is a frame.

In some embodiments, the first die 260 is a logic die, which may be a central processing unit (CPU) die, a micro control unit (MCU) die, an input-output (IO) die, a baseband (BB) die, an application processor (AP) die, or the like. In some embodiments, the first die 260 is a memory die such as a dynamic random-access memory (DRAM) die or a static random-access memory (SRAM) die, or may be another type of die. The first die 260 may include active devices such as transistors and/or diodes, and may include passive devices such as capacitors, inductors, resistors, or the like.

In some embodiments, the second die 280 is a logic die, which may be a CPU die, an MCU die, an IO die, a BB die, an AP die, or the like. In some embodiments, the second die 280 is a memory die such as a DRAM die or an SRAM die. In other embodiments, the second die 280 may be another type of die. The second die 280 may include active devices such as transistors and/or diodes, and may include passive devices such as capacitors, inductors, resistors, or the like. Although one second die 280 is illustrated, there may be a plurality of second dies 280 disposed adjacent to the first die 260. The first die 260 and the second die 280 may be similar to or different from each other.

In some embodiments, in step 405, the first die carrier 250 carrying the first die 260 and the second die 280 is transported from the first cassette load port 152 into the second chamber 151. In some embodiments, a frame transfer device 154 carries the first die carrier 250. In some embodiments, a slit door 153 between the second chamber 151 and the first cassette load port 152 is opened, and the first die carrier 250 carried by the frame transfer device 154 is loaded into the second chamber 151. In some embodiments, after the first die carrier 250 is loaded into the second chamber 141, the slit door 153 is closed.

The wafer holder 211 and the frame type cassette 251 may be loaded in the apparatus 100 simultaneously or separately. The wafer 210 may be loaded into the first chamber 141 before or after the first die carrier 250 is loaded into the second chamber 251. Step 402 and step 403 may performed simultaneously or separately. Step 404 and step 405 may performed simultaneously or separately.

Figure 7:
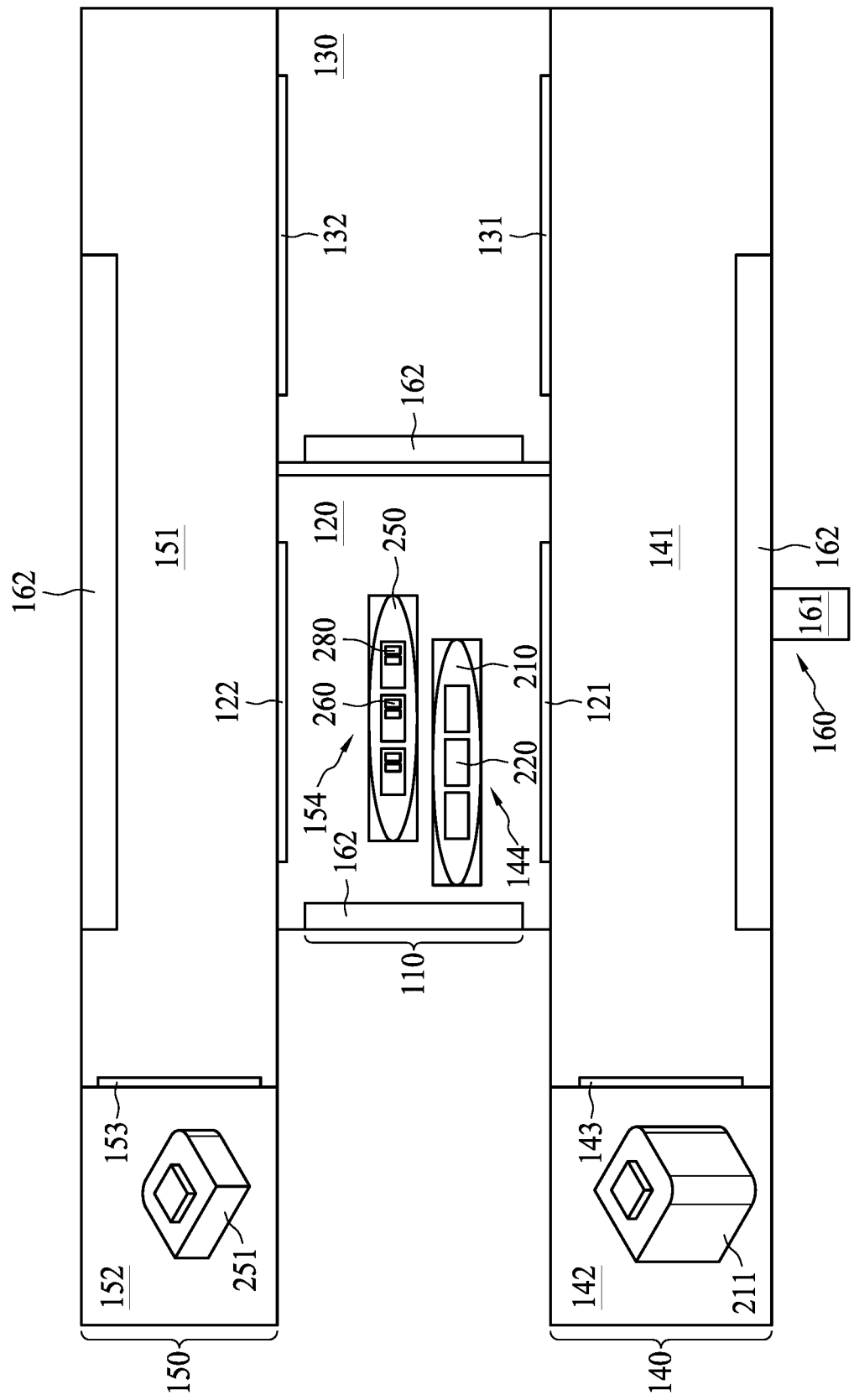

Referring to FIGS. 4 and 7, in some embodiments, in step 406, the wafer 210 is transported from the first chamber 141 into the first bonding chamber 120. In some embodiments, the wafer 210 is carried by the wafer transfer device 144. In some embodiments, the wafer 210 enters the first bonding chamber 120 through a first slit door 121 of the first bonding chamber 120. In some embodiments, after the wafer 210 enters the first bonding chamber 120, the first slit door 121 is closed.

In some embodiments, in step 407, the first die carrier 250 carrying the first die 260 and the second die 280 is transported from the second chamber 151 into the first bonding chamber 120. In some embodiments, the first die carrier 250 carrying only the first die 260 is transported from the second chamber 151 into the first bonding chamber 120. In some embodiments, the first die carrier 250 is carried by the frame transfer device 154. In some embodiments, after the first die carrier 250 enters the first bonding chamber 120, the second slit door 122 is closed.

The wafer 210 and the first die carrier 250 carrying the first die 260 and the second die 280 may be transferred to the first bonding chamber 120 simultaneously or separately. The wafer 210 may be loaded into the first bonding chamber 120 before or after the first die carrier 250 is loaded into the first bonding chamber 120. Step 406 and step 407 may performed simultaneously or separately.

Figure 8A:
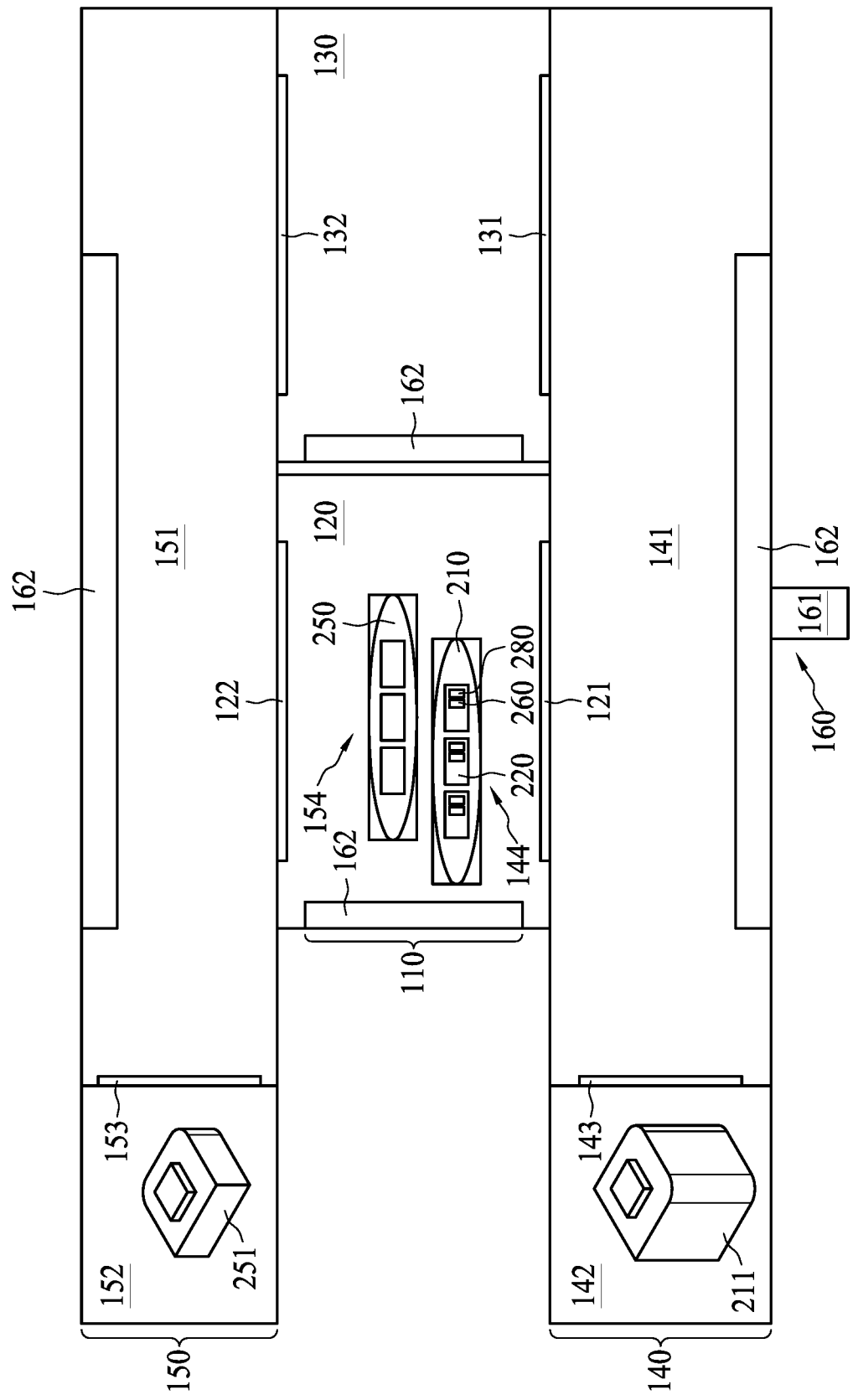
Figure 8B:
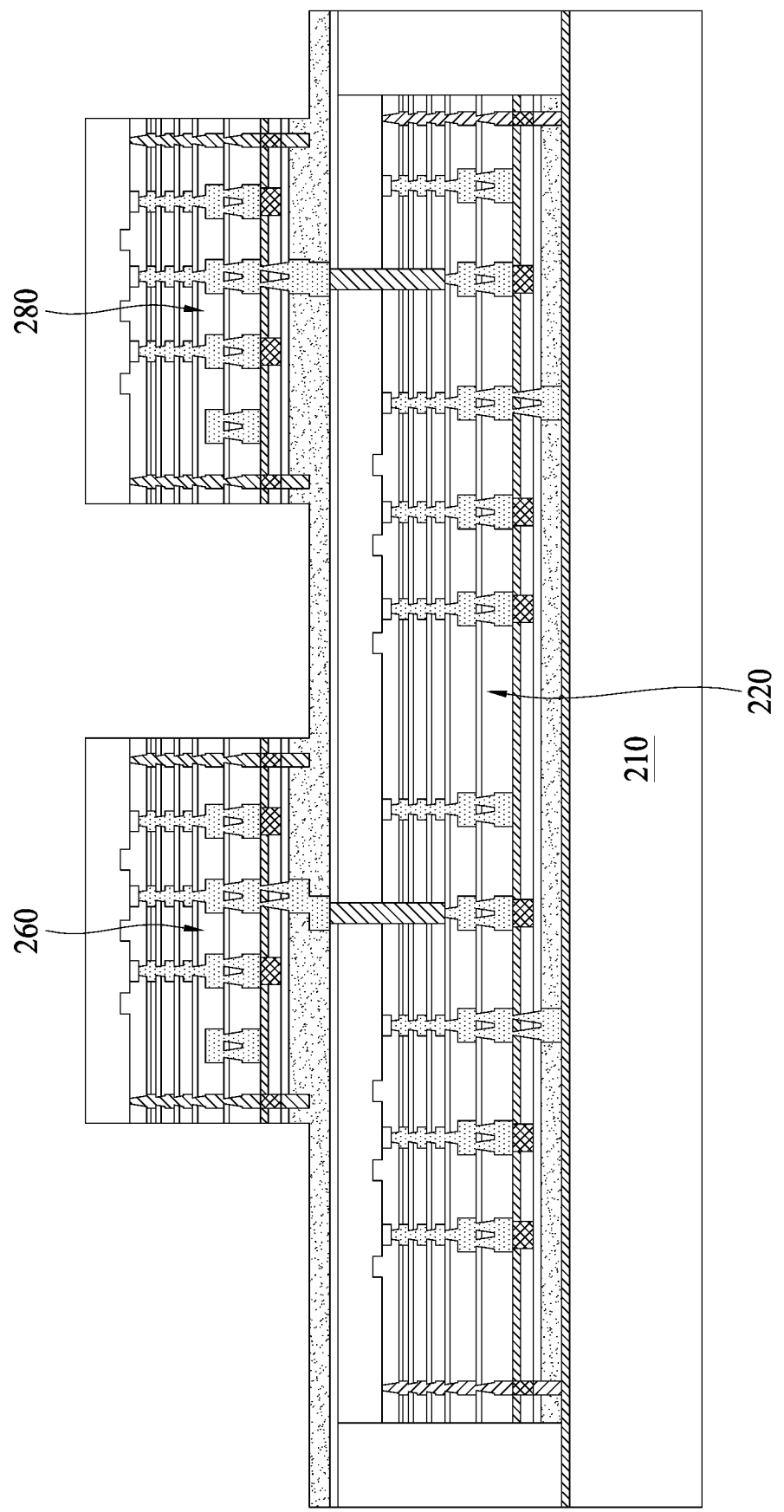

Referring to FIGS. 4, 8A and 8B, in some embodiments, in step 408, the first die 260 and the second die 280 on the first die carrier 250 are picked up and the first die 260 and the second die 280 are bonded to the wafer 210 in the first bonding chamber 120. The first die 260 and the second die 280 may be bonded to a same semiconductor substrate area 220 or different semiconductor substrate areas 220. In some embodiments, the first die 260 and the second die 280 are bonded to the same semiconductor substrate area 220. In some embodiments, the first bonding chamber 120 is a hybrid bonding chamber, and the first die 260 and the second die 280 are hybrid bonded to the wafer 210. In some embodiments, the second die 280 is disposed adjacent to the first die 260, and the first die 260 and the second die 280 are bonded to the wafer 210 simultaneously or separately. In some embodiments, only the first die 260 is picked up and bonded to the wafer 210. In some embodiments, the first slit door 121 and the second slit door 122 are closed during the bonding of the first die 260 and the wafer 210.

Figure 8C:
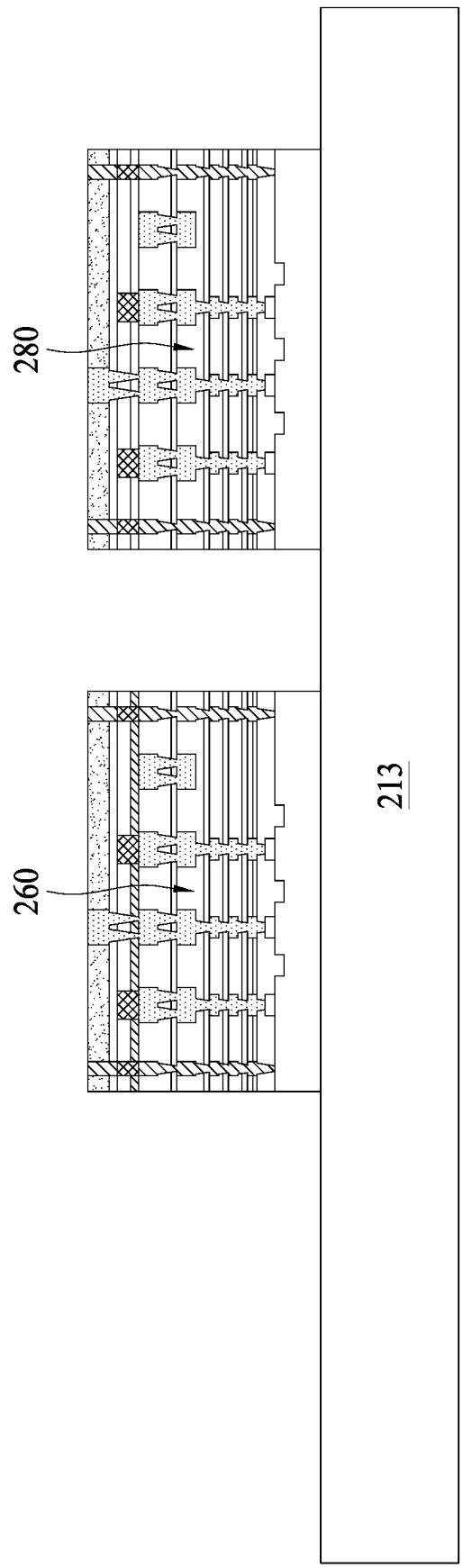

Referring to FIGS. 4 and 8C, in some embodiments, the wafer transfer device 144 transfers a substrate 213 into the first bonding chamber 120, and the first die 260 and the second die 280 are bonded to the substrate 213 in the first bonding chamber 120. In some embodiments, the first die 260 and the second die 280 are hybrid bonded to the substrate 213.

Figure 9:
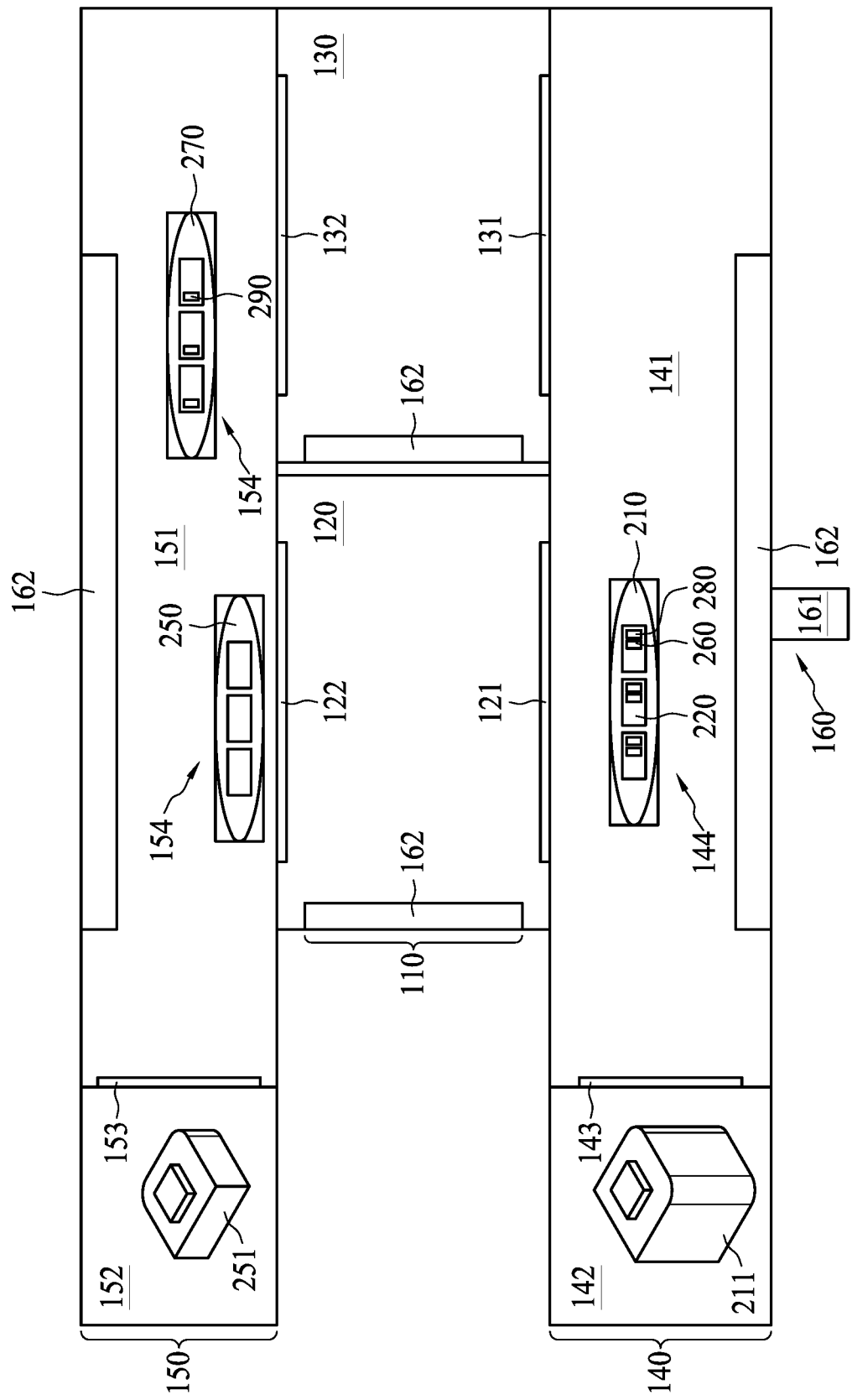

Referring to FIGS. 4 and 9, in some embodiments, in step 409, the wafer 210, bonded to the first die 260 and the second die 280, is transported from the first bonding chamber 120 to the first chamber 141. The wafer 210 is transported by the wafer transfer device 144 through the first slit door 121. In some embodiments, the wafer 210, bonded to only the first die 260, is transported from the first bonding chamber 120 to the first chamber 141.

In some embodiments, in step 410, the first die carrier 250 is transported from the first bonding chamber 120 to the second chamber 151. In some embodiments, the first die carrier 250 is transported from the first bonding chamber 120 to the second chamber 151 by the frame transfer device 154 through the second slit door 122. The first die carrier 250 and the wafer 210 exit the first bonding chamber 120 simultaneously or separately. In some embodiments, step 409 and step 410 may be performed simultaneously or separately.

In some embodiments, in step 411, environmental conditions of a second bonding chamber 130 of an apparatus 100 are adjusted to be the same as the environmental conditions of the first chamber 141 and the first bonding chamber 120. In some embodiments, the environmental conditions of the second bonding chamber 130 are adjusted by the control system 160 including the central processor 161 and the environmental controllers 162 disposed in the second bonding chamber 130 and electrically connected to the central processor 161. In some embodiments, the environmental controllers 162 control temperature, humidity, air flow rate, pressure, amount of total volatile organic compound, and amount of particles of the second bonding chamber 130. In some embodiments, step 401 and step 411 may be performed simultaneously or separately.

In some embodiments, in step 412, a second die carrier 270 carrying a third die 290 is loaded into the second chamber 151. In some embodiments, similar to the first die carrier 250, the second die carrier 270 carrying the third die 290 is unloaded from a first frame type cassette 251 or another frame type cassette (not shown) in the cassette load port 152. In some embodiments, the frame transfer device 154 carries the second die carrier 270.

In some embodiments, the third die 290 is a dummy die. In some embodiments, the third die 290 is a logic die, which may be a CPU die, an MCU die, an IO die, a BB die, an AP die, or the like. In some embodiments, the third die 290 is a memory die such as a DRAM die or an SRAM die. In other embodiments, the third die 290 may be another type of die. The third die 290 may include active devices (not shown) such as transistors and/or diodes, and may include passive devices (not shown) such as capacitors, inductors, resistors, or the like. Although one third die 290 is illustrated, there may be a plurality of third dies 290 disposed adjacent to or over the first die 260. The third die 290, the first die 260 and the second die 280 may be similar to or different from each other.

Figure 10:
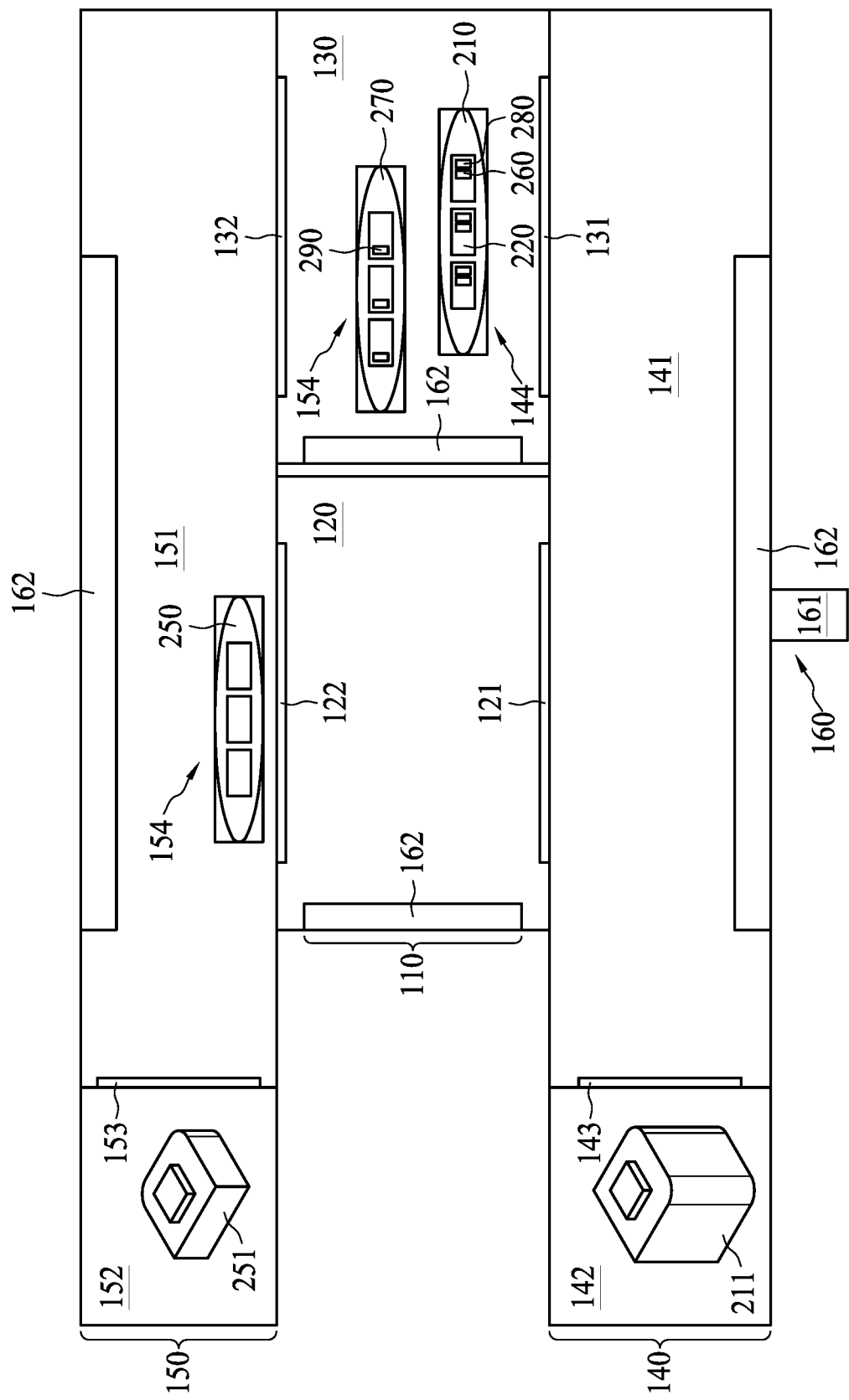

Referring to FIGS. 4 and 10, in some embodiments, in step 413, the wafer 210, bonded to the first die 260 and the second die 280, is transported from the first chamber 141 to the second bonding chamber 130. In some embodiments, the wafer 210, bonded to only the first die 260, enters the second bonding chamber 130. In some embodiments, the wafer 210, bonded to the first die 260 and the second die 280, enters the second bonding chamber 130 through a third slit door 131 of the second bonding chamber 130. In some embodiments, after the wafer 210 enters the second bonding chamber 130, the third slit door 131 is closed.

In some embodiments, in step 414, the second die carrier 270 carrying the third die 290 is transported from the second chamber 151 into the second bonding chamber 130 through a fourth slit door 132. In some embodiments, after the second die carrier 270 enters the second bonding chamber 130, the fourth slit door 132 is closed.

The wafer 210 and the second die carrier 270 carrying the third die 290 may be transferred to the second bonding chamber 130 simultaneously or separately. The wafer 210 may be loaded into the second bonding chamber 130 before or after the second die carrier 270 is loaded into the second bonding chamber 130. Step 413 and step 414 may performed simultaneously or separately.

Figure 11A:
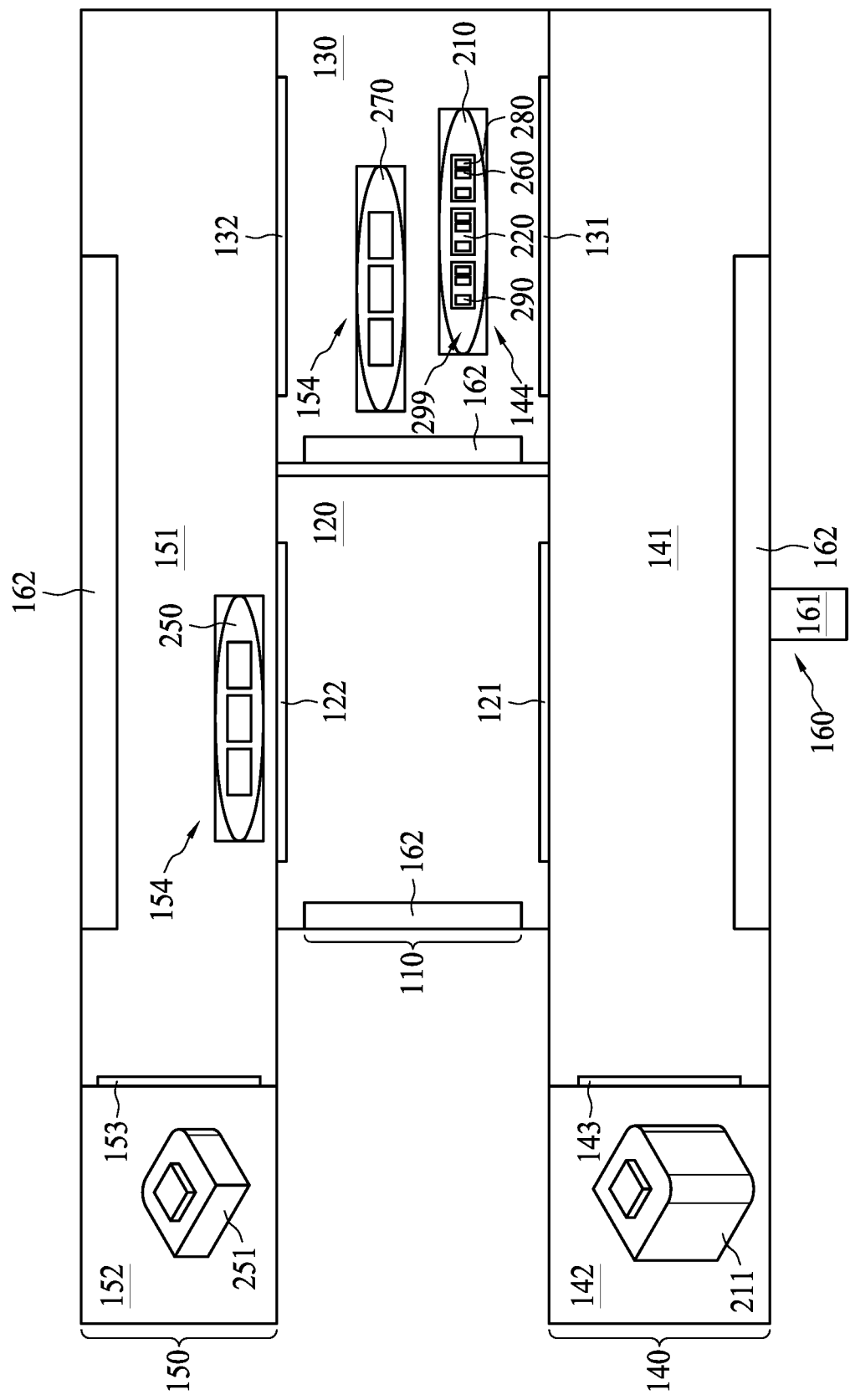
Figure 11B:
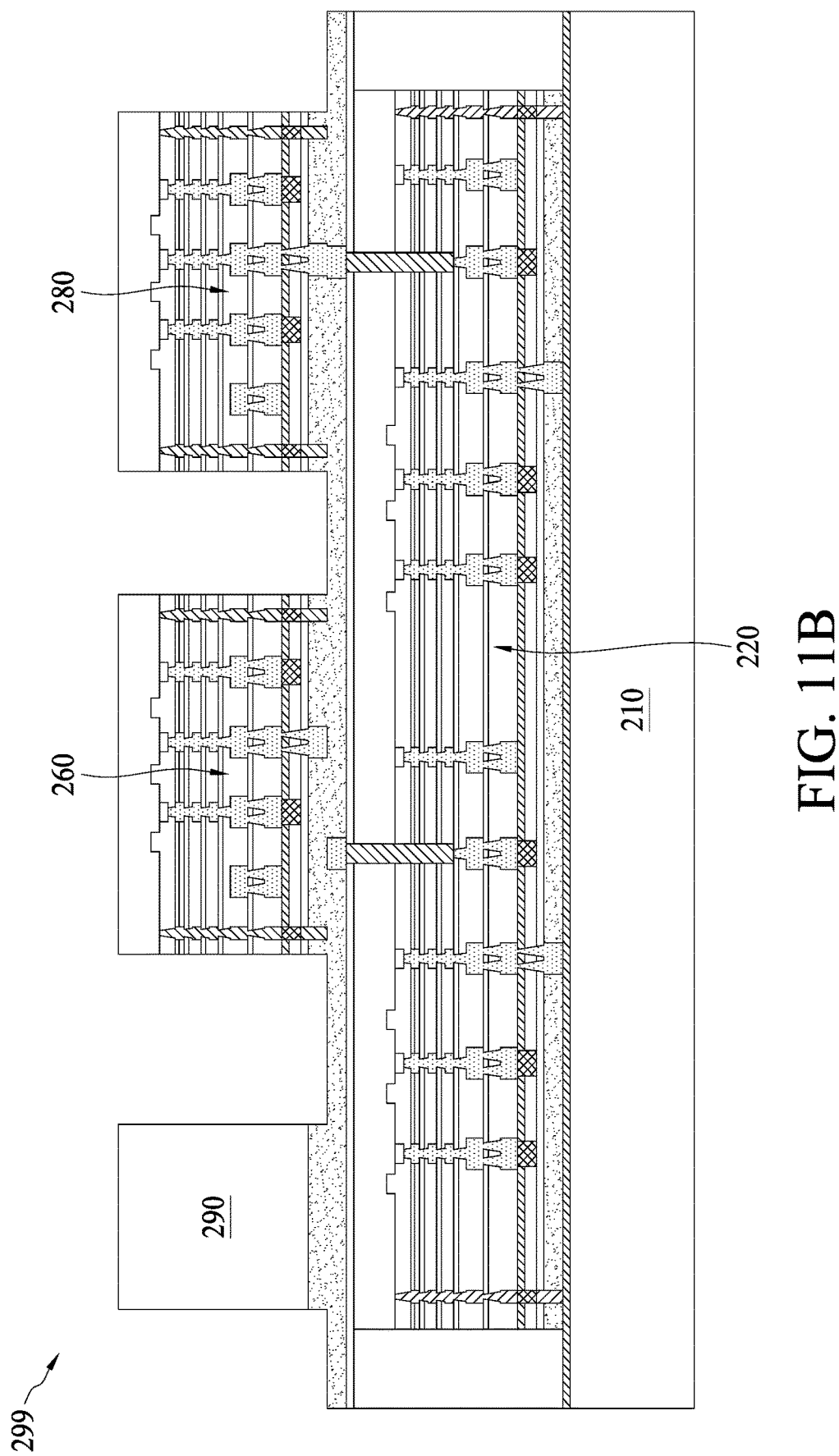

Referring to FIGS. 4, 11A and 11B, in some embodiments, in step 415, the third die 290 on the second die carrier 270 is picked up and bonded to the wafer 210, which is bonded to the first die 260 and the second die 280, in the second bonding chamber 130. In some embodiments, the wafer 210, the first die 260, the second die 280 and the third die 290 form a bonded semiconductor structure 299. In some embodiments, the third die 290 is bonded to the semiconductor substrate area 220, where the first die 260 and the second die 280 are disposed. In some embodiments, the second bonding chamber 130 is a fusion bonding chamber, and the third die 290 is fusion bonded to the wafer 210. In some embodiments, the third die 290 is disposed adjacent to the first die 260. In some embodiments, the third slit door 131 and the fourth slit door 132 are closed during the bonding of the third die 290 to the wafer 210.

Figure 11C:
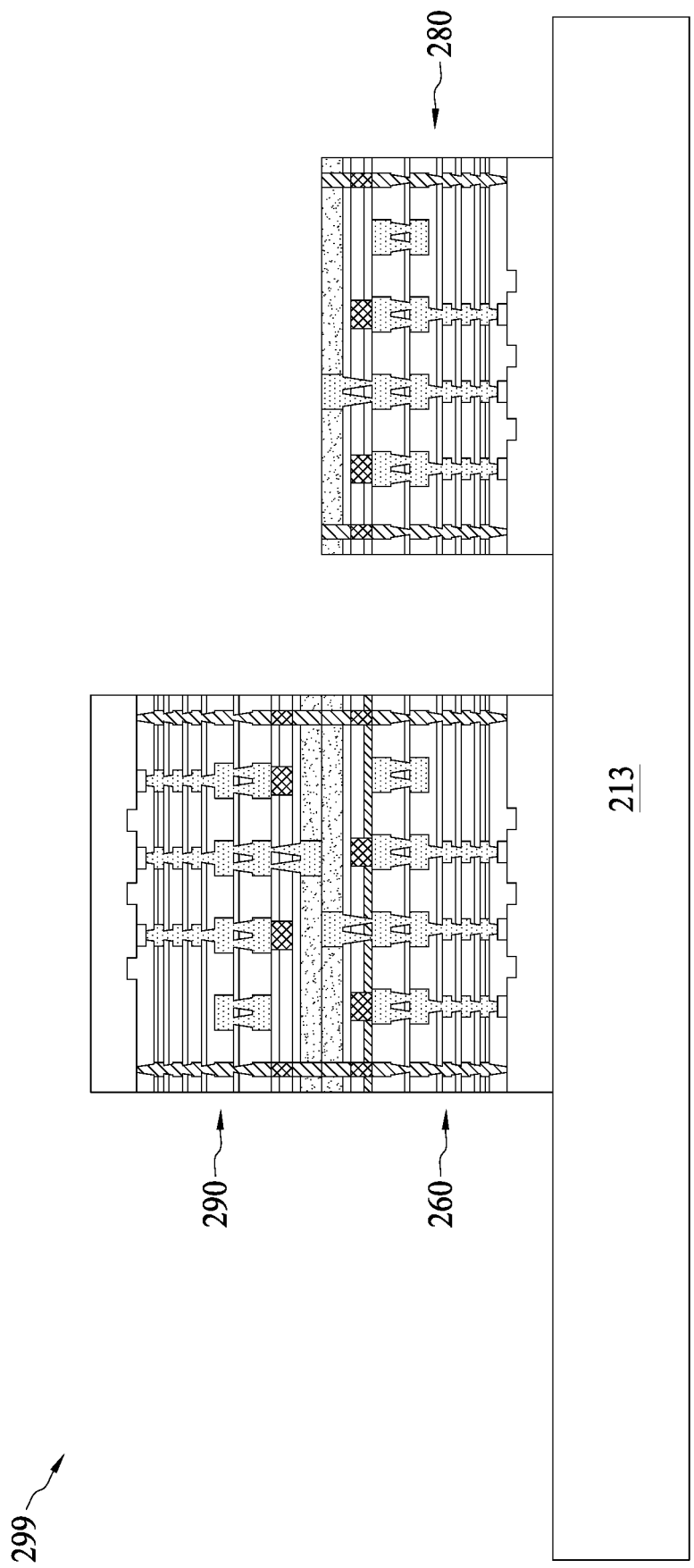

Referring to FIGS. 4 and 11C, in some embodiments, the third die 290 on the second die carrier 270 is picked up and bonded to the substrate 213, which is bonded to the first die 260 and the second die 280, in the second bonding chamber 130. In some embodiments, the third die 290 is disposed over the first die 260 and/or the second die 280. In some embodiments, the third die 290 is fusion bonded to the first die 260 and/or the second die 280. In some embodiments, the substrate 213, the first die 260, the second die 280 and the third die 290 form a bonded semiconductor structure 299.

Figure 12:
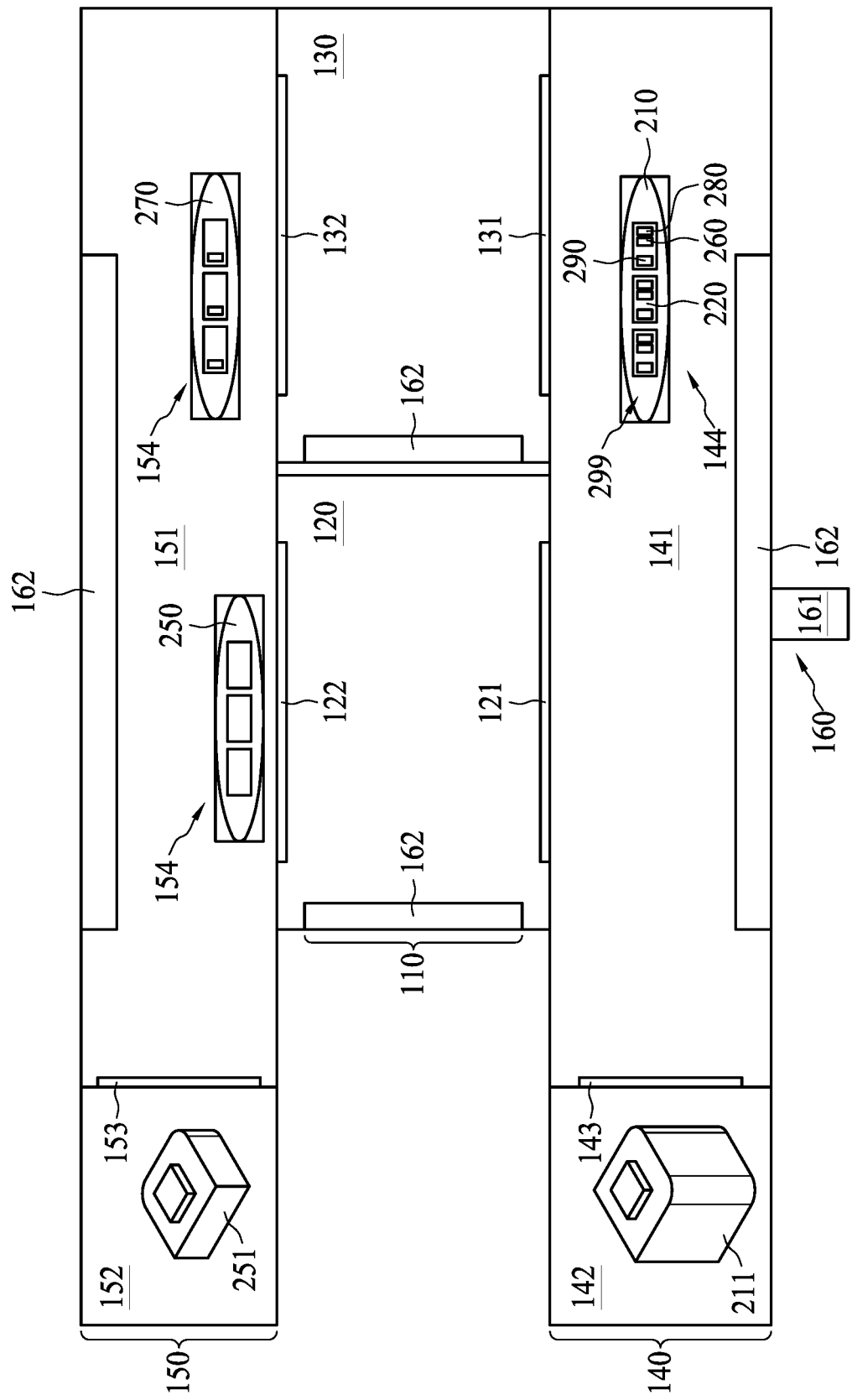

Referring to FIGS. 4 and 12, in some embodiments, in step 416, the bonded semiconductor structure 299 is transported from the second bonding chamber 130 to the first chamber 141. In some embodiments, the wafer transfer device 144 transports the bonded semiconductor structure 299 through the third slit door 131.

In some embodiments, in step 417, the second die carrier 270 is transported from the second bonding chamber 130 to the second chamber 151. In some embodiments, the second die carrier 270 is transported from the second bonding chamber 130 to the second chamber 151 by the frame transfer device 154 through the fourth slit door 132. In some embodiments, step 416 and step 417 may be performed simultaneously or separately.

Figure 13:
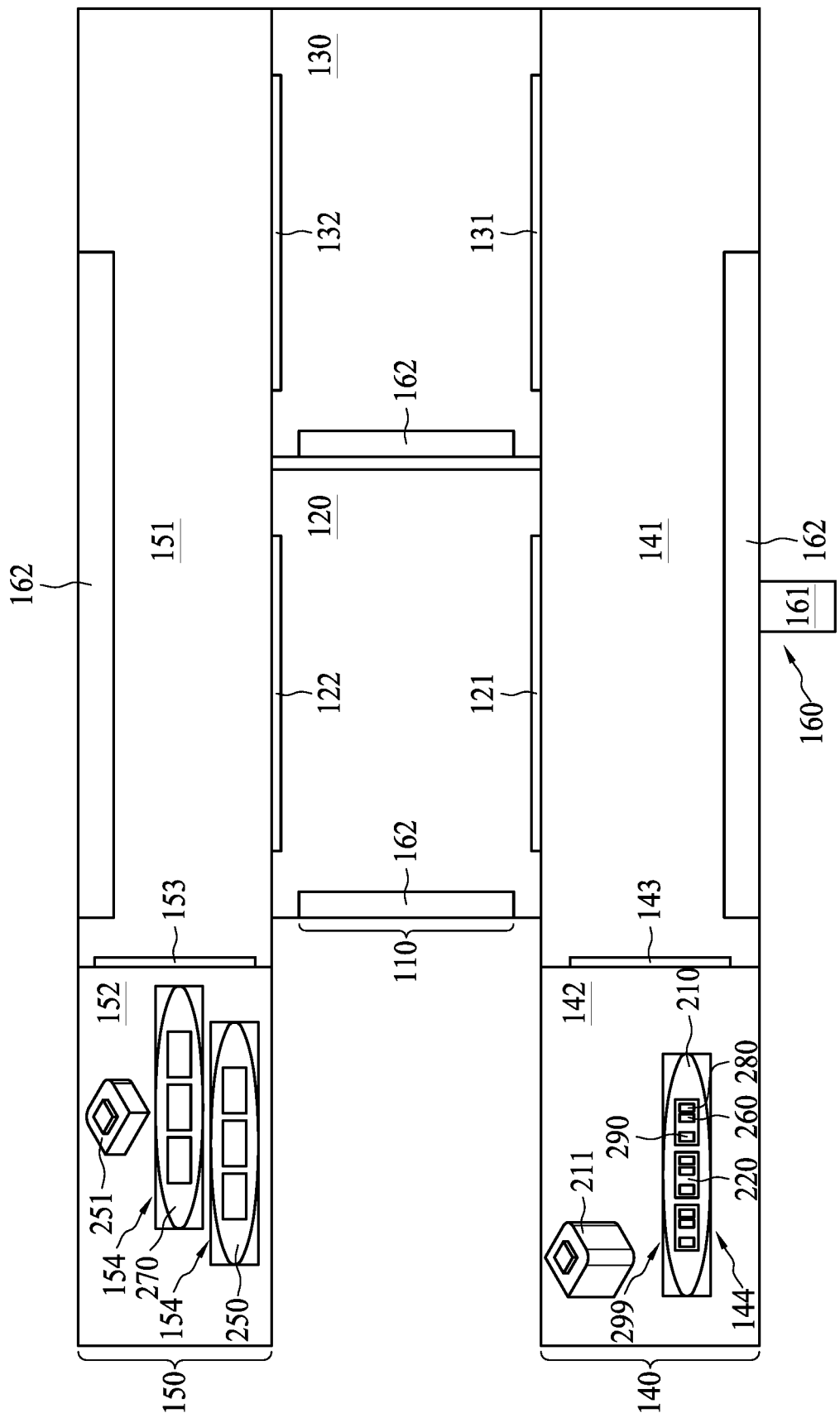

Referring to FIGS. 4 and 13, in some embodiments, in step 418, the bonded semiconductor structure 299 is transported from the first chamber 141 to the first wafer load port 142. In some embodiments, the bonded semiconductor structure 299 enters the first wafer load port 142 through the slit door 143 between the first chamber 141 and the first wafer load port 142. In some embodiments, after the bonded semiconductor structure 299 is transported to the first wafer load port 142, the slit door 143 is closed.

In some embodiments, in step 419, the bonded semiconductor structure 299 is loaded into the wafer holder 211 in the first wafer load port 142. In some embodiments, the bonded semiconductor structure 299 is unloaded from the wafer transfer module 140.

Figure 14:
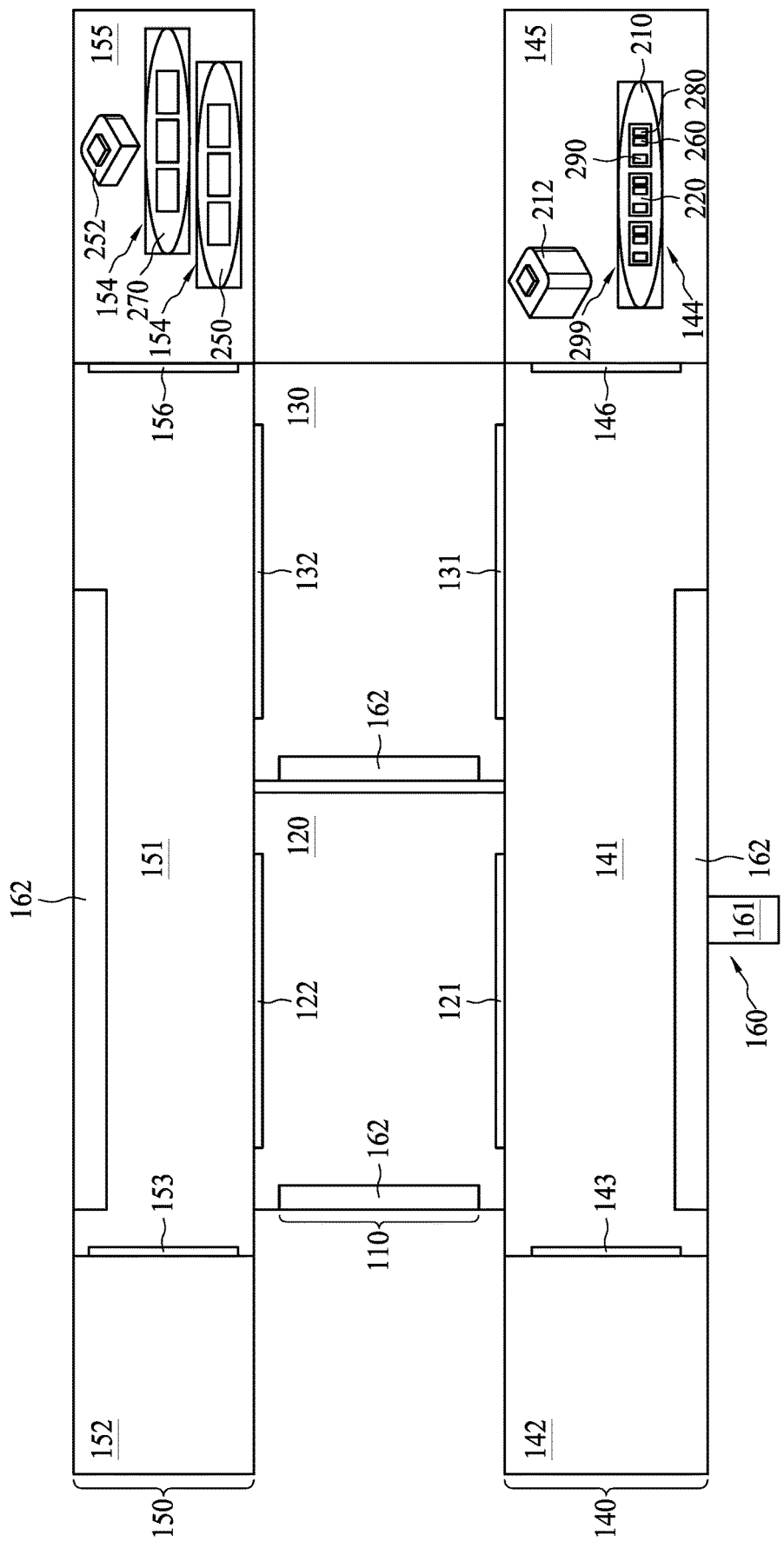

In some embodiments, referring to FIG. 14, the bonded semiconductor structure 299 is transported from the first chamber 141 to a second wafer load port 145 separate from the first wafer load port 142. In some embodiments, the bonded semiconductor structure 299 enters the second wafer load port 145 through a slit door 146 between the first chamber 141 and the second wafer load port 145. In some embodiments, after the bonded semiconductor structure 299 is transported to the second wafer load port 145, the slit door 146 is closed. In some embodiments, the bonded semiconductor structure 299 is loaded onto a wafer holder 212 in the second wafer load port 145. In some embodiments, environmental conditions of the second wafer load port 145 are controlled and adjusted by the control system 160. In some embodiments, the first chamber 141 and the second wafer load port 145 are under same environmental conditions controlled by the control system 160.

Referring back to FIGS. 4 and 13, in some embodiments, in step 420, the first die carrier 250 and the second die carrier 270 are transported from the second chamber 151 to the first cassette load port 152 simultaneously or separately. In some embodiments, the first die carrier 250 and the second die carrier 270 enter the first cassette load port 152 through the slit door 153 between the second chamber 151 and the first cassette load port 152. In some embodiments, after the first die carrier 250 and the second die carrier 270 are transported to the first cassette load port 152, the slit door 153 is closed.

In some embodiments, in step 421, the first die carrier 250 and the second die carrier 270 are loaded onto the frame type cassette 251 in the first cassette load port 152. In some embodiments, the first die carrier 250 and the second die carrier 270 are unloaded from the die transfer module 150.

In some embodiments, referring to FIG. 14, the first die carrier 250 and the second die carrier 270 are transported from the second chamber 151 to a second cassette load port 155 simultaneously or separately. In some embodiments, the first die carrier 250 and the second die carrier 270 enter the second cassette load port 155 through a slit door 156 between the second chamber 151 and the second cassette load port 155. In some embodiments, after the first die carrier 250 and the second die carrier 270 are transported to the second cassette load port 155, the slit door 156 is closed. In some embodiments, the first die carrier 250 and the second die carrier 270 are loaded onto a frame type cassette 252 in the second cassette load port 155. In some embodiments, environmental conditions of the second cassette load port 155 are controlled and adjusted by the control system 160. In some embodiments, the second chamber 151 and the second cassette load port 155 are under same environmental conditions controlled by the control system 160. The first die carrier 250 and the second die carrier 270 can be transported to the first cassette load port 152 or the second cassette load port 155 respectively.

Figure 15:
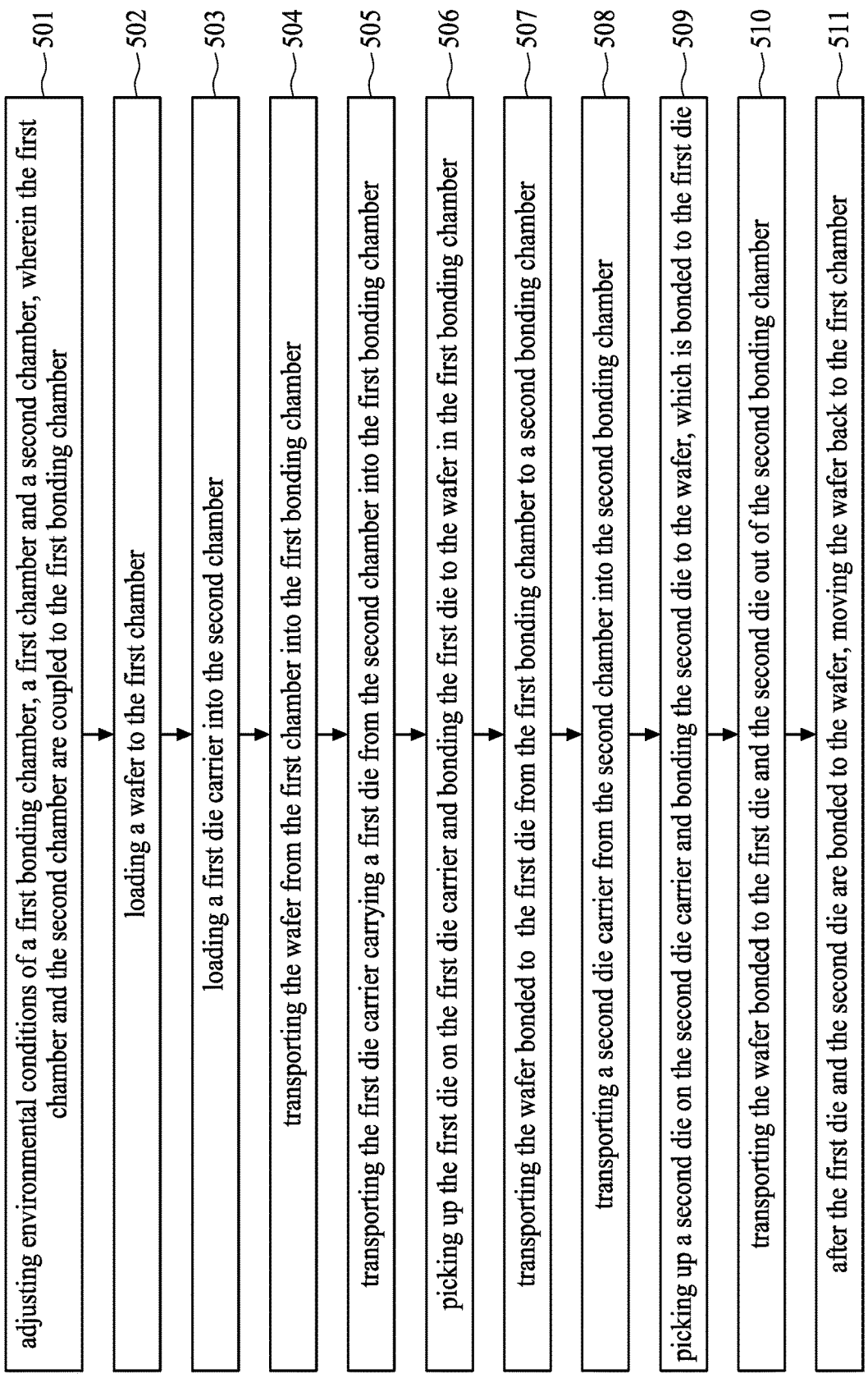
FIG. 15 is a flowchart illustrating a method, in accordance with some embodiments of the present disclosure.

FIG. 15 is a flowchart of a method 500 in accordance with some embodiments. Additional steps can be provided before, during, and after the steps shown in FIG. 15, and some of the steps described below can be replaced or eliminated in other embodiments of the method 500. The order of the steps may be interchangeable.

In step 501, environmental conditions of a first bonding chamber, a first chamber and a second chamber are adjusted, wherein the first chamber and the second chamber are coupled to the first bonding chamber. In step 502, a wafer is loaded into the first chamber. In step 503, a first die carrier is loaded into the second chamber. In step 504, the wafer is transported from the first chamber into the first bonding chamber. In step 505, the first die carrier carrying a first die is transported from the second chamber into the first bonding chamber. In step 506, the first die on the first die carrier is picked up and the first die is bonded to the wafer in the first bonding chamber. In step 507, the wafer, bonded to the first die, is transported from the first bonding chamber to a second bonding chamber. In step 508, a second die carrier is transported from the second chamber into the second bonding chamber. In step 509, a second die on the second die carrier is picked up and bonded to the wafer, which is bonded to the first die. In step 510, the wafer, bonded to the first die and the second die, is transported out of the second bonding chamber. In step 511, after the first die and the second die are bonded to the wafer, the wafer is moved back to the first chamber.

Figure 16:
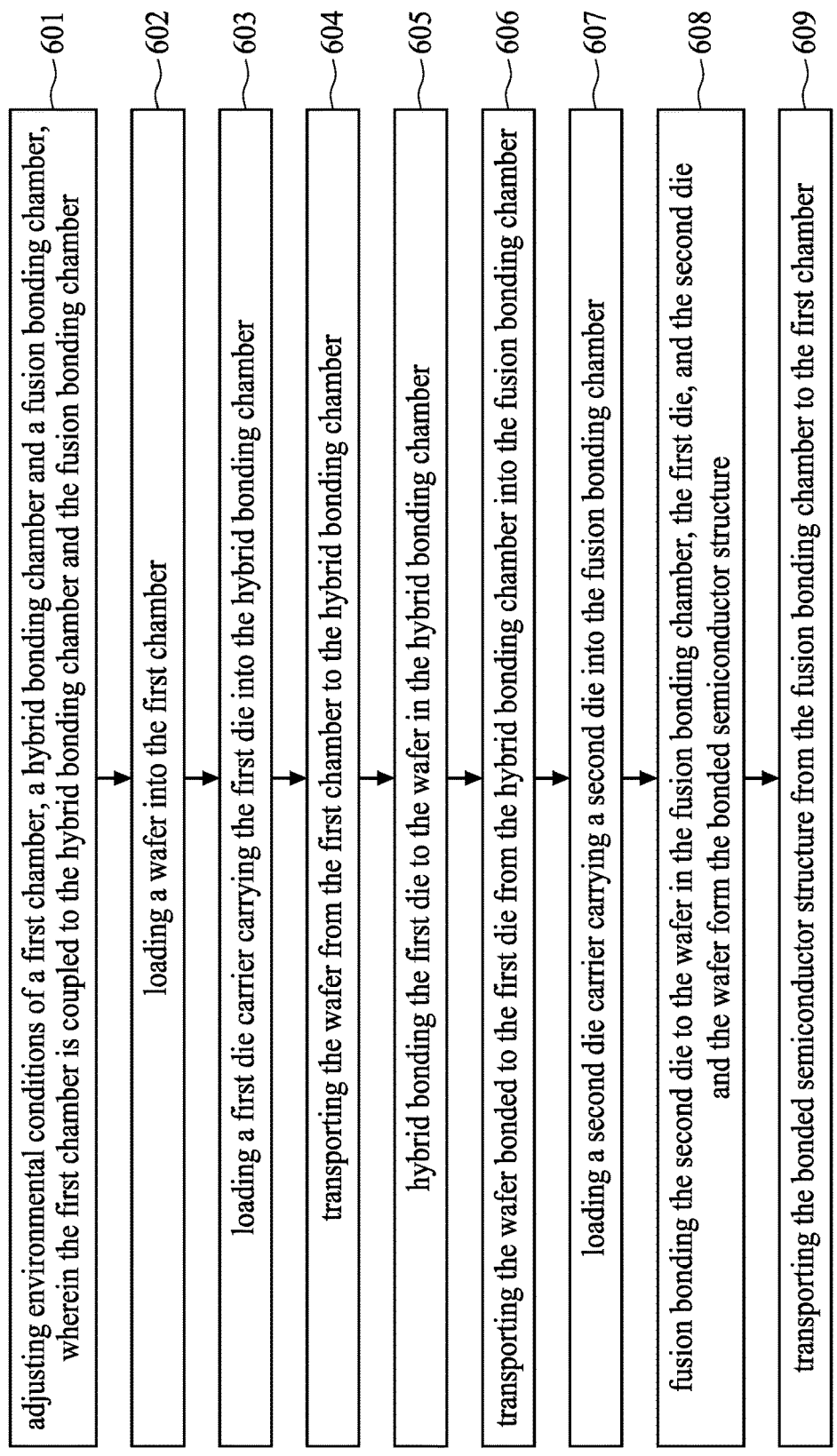
FIG. 16 is a flowchart illustrating a method, in accordance with some embodiments of the present disclosure.

FIG. 16 is a flowchart of a method 600 in accordance with some embodiments. Additional steps can be provided before, during, and after the steps shown in FIG. 16, and some of the steps described below can be replaced or eliminated in other embodiments of the method 600. The order of the steps may be interchangeable.

In step 601, environmental conditions of a first chamber, a hybrid bonding chamber and a fusion bonding chamber are adjusted, wherein the first chamber is coupled to the hybrid bonding chamber and the fusion bonding chamber. In step 602, a wafer is loaded into the first chamber. In step 603, a first die carrier carrying the first die is loaded into the hybrid bonding chamber. In step 604, the wafer is transported from the first chamber to the hybrid bonding chamber. In step 605, the first die is hybrid bonded to the wafer in the hybrid bonding chamber. In step 606, the wafer, bonded to the first die, is transported from the hybrid bonding chamber into the fusion bonding chamber. In step 607, a second die carrier carrying a second die is loaded into the fusion bonding chamber. In step 608, the second die is fusion bonded to the wafer in the fusion bonding chamber, and the first die, the second die and the wafer form the bonded semiconductor structure. In step 609, the bonded semiconductor structure is transported from the fusion bonding chamber to the first chamber.

In accordance with some embodiments of the disclosure, an apparatus for manufacturing a bonded semiconductor structure includes a wafer processing unit, a wafer transfer module, a die transfer module, and a control system. The wafer processing unit includes a first bonding chamber and a second bonding chamber. The wafer transfer module includes a first chamber coupled to the first bonding chamber and the second bonding chamber, wherein the wafer transfer module is configured to transport a wafer within the first chamber and into and out of the wafer processing unit. The die transfer module is separate from the wafer transfer module and includes a second chamber coupled to the first bonding chamber and the second bonding chamber, wherein the die transfer module is configured to transport a die carrier within the second chamber and into and out of the wafer processing unit. The control system is configured to control environmental conditions of the first bonding chamber, the second bonding chamber, the first chamber and the second chamber. The first bonding chamber, the second bonding chamber, the first chamber and the second chamber are under same environmental conditions controlled by the control system.

In accordance with some embodiments of the disclosure, a method for manufacturing a bonded semiconductor structure includes adjusting environmental conditions of a first bonding chamber, a first chamber and a second chamber, wherein the first chamber and the second chamber are coupled to the first bonding chamber; loading a wafer into the first chamber; loading a first die carrier into the second chamber; transporting the wafer from the first chamber into the first bonding chamber; and transporting the first die carrier carrying a first die from the second chamber into the first bonding chamber. The method further includes picking up the first die on the first die carrier and bonding the first die to the wafer in the first bonding chamber; transporting the wafer, bonded to the first die, from the first bonding chamber to a second bonding chamber; transporting a second die carrier from the second chamber into the second bonding chamber; picking up a second die on the second die carrier and bonding the second die to the wafer, which is bonded to the first die; transporting the wafer, bonded to the first die and the second die, out of the second bonding chamber; and after the first die and the second die are bonded to the wafer, moving the wafer back to the first chamber.

In accordance with some embodiments of the disclosure, a method for manufacturing a bonded semiconductor structure includes adjusting environmental conditions of a first chamber, a hybrid bonding chamber and a fusion bonding chamber, wherein the first chamber is coupled to the hybrid bonding chamber and the fusion bonding chamber; loading a wafer into the first chamber; loading a first die carrier carrying the first die into the hybrid bonding chamber; transporting the wafer from the first chamber to the hybrid bonding chamber; and hybrid bonding the first die to the wafer in the hybrid bonding chamber. The method further includes transporting the wafer, bonded to the first die, from the hybrid bonding chamber into the fusion bonding chamber; loading a second die carrier carrying a second die into the fusion bonding chamber; fusion bonding the second die to the wafer in the fusion bonding chamber, wherein the first die, the second die and the wafer form the bonded semiconductor structure; and transporting the bonded semiconductor structure from the fusion bonding chamber to the first chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a bonded semiconductor structure, comprising:

adjusting environmental conditions of a first bonding chamber, a first chamber and a second chamber, wherein the first chamber and the second chamber are coupled to the first bonding chamber;

loading a wafer into the first chamber;

loading a first die carrier into the second chamber;

transporting the wafer from the first chamber into the first bonding chamber;

transporting the first die carrier carrying a first die from the second chamber into the first bonding chamber;

picking up the first die on the first die carrier and bonding the first die to the wafer in the first bonding chamber;

transporting the wafer, bonded to the first die, from the first bonding chamber to a second bonding chamber;

transporting a second die carrier from the second chamber into the second bonding chamber;

picking up a second die on the second die carrier and bonding the second die to the wafer, which is bonded to the first die;

transporting the wafer, bonded to the first die and the second die, out of the second bonding chamber; and after the first die and the second die are bonded to the wafer, moving the wafer back to the first chamber.

2. The method of claim 1, further comprising:
unloading the wafer from a wafer holder in a wafer load port;
transporting the wafer from the wafer load port into the first chamber.

3. The method of claim 1, further comprising:
transporting the wafer, bonded to the first die and the second die, from the first chamber to a wafer load port; and
loading the wafer, bonded to the first die and the second die, to a wafer holder in the wafer load port.

4. The method of claim 1, further comprising:
unloading the first die carrier carrying the first die from a frame type cassette in a cassette load port; and
transporting the first die carrier carrying the first die from the cassette load port into the second chamber.

5. The method of claim 1, further comprising:
transporting the first die carrier from the second chamber to a cassette load port; and
loading the first die carrier onto a frame type cassette in the cassette load port.

6. The method of claim 1, further comprising:
adjusting environmental conditions of the second bonding chamber to be the same as the environmental conditions of the first chamber and the first bonding chamber;
transporting the wafer, bonded to the first die, from the first bonding chamber to the first chamber;
transporting the wafer, bonded to the first die, from the first chamber to the second bonding chamber;
loading the second die carrier carrying the second die into the second bonding chamber;
bonding the second die to the wafer in the second bonding chamber, wherein the second die is disposed adjacent to the first die, and the wafer, the first die and the second die form a bonded semiconductor structure; and
transporting the bonded semiconductor structure to the first chamber.

7. The method of claim 1, wherein the wafer enters and exits the first bonding chamber through a first slit door of the first bonding chamber, and the first die carrier enters and exits the first bonding chamber through a second slit door of the first bonding chamber.

8. A method for manufacturing a bonded semiconductor structure, comprising:
adjusting environmental conditions of a first chamber, a hybrid bonding chamber and a fusion bonding chamber, wherein the first chamber is coupled to the hybrid bonding chamber and the fusion bonding chamber;
loading a wafer into the first chamber;
loading a first die carrier carrying the first die into the hybrid bonding chamber;
transporting the wafer from the first chamber to the hybrid bonding chamber;
hybrid bonding the first die to the wafer in the hybrid bonding chamber;
transporting the wafer, bonded to the first die, from the hybrid bonding chamber into the fusion bonding chamber;
loading a second die carrier carrying a second die into the fusion bonding chamber;
fusion bonding the second die to the wafer in the fusion bonding chamber, wherein the first die, the second die and the wafer form the bonded semiconductor structure; and
transporting the bonded semiconductor structure from the fusion bonding chamber to the first chamber.

9. The method of claim 8, further comprising:
loading the first die carrier carrying a third die into the hybrid bonding chamber; and
hybrid bonding the third die to the wafer in the hybrid bonding chamber,
wherein the third die is disposed adjacent to the first die, and the first die and the third die are bonded to the wafer simultaneously or separately.

10. The method of claim 8, wherein the environmental conditions of the first chamber, the hybrid bonding chamber and the fusion bonding chamber are adjusted by a control system.

11. The method of claim 8, wherein temperature, humidity, air flow rate, pressure, amount of total volatile organic compound, and amounts of particles of the hybrid bond chamber and the fusion bond chamber are adjusted.

12. The method of claim 8, further comprising:
unloading the wafer from a first wafer holder in a first wafer load port coupled to the first chamber;
transporting the wafer from the first wafer load port to the first chamber;
transporting the bonded semiconductor structure from the fusion chamber to the first chamber; and
loading the bonded semiconductor structure into a second wafer holder through a second wafer load port.

13. A method for manufacturing a bonded semiconductor structure, comprising:
adjusting environmental conditions of a first chamber of a wafer transfer module and a first bonding chamber of a wafer processing unit by a control system, wherein the first chamber is coupled to the first bonding chamber;
transporting a wafer into including the first chamber;
loading a first die carrier carrying a first die into the first bonding chamber;
transporting the wafer from the first chamber to the first bonding chamber;
hybrid bonding the first die to the wafer in the first bonding chamber;
adjusting environmental conditions of a second bonding chamber of the wafer processing unit by the control system, wherein the first chamber is coupled to the second bonding chamber;
transporting the wafer bonded to the first die from the first bonding chamber into the second bonding chamber;
loading a second die carrier carrying a second die into the second bonding chamber;
fusion bonding the second die to the wafer in the second bonding chamber, wherein the first die, the second die and the wafer form the bonded semiconductor structure; and
transporting the bonded semiconductor structure from the second bonding chamber to the first chamber.

14. The method of claim 13, further comprising:
adjusting environmental conditions of a second chamber of a die transfer module by the control system; and
transporting the first die carrier carrying the first die into the second chamber before loading the first die carrier carrying the first die into the first bonding chamber.

15. The method of claim 14, wherein environmental conditions of the first chamber and the environmental conditions of the second chamber are adjusted simultaneously.

16. The method of claim 14, wherein environmental conditions of the first chamber and the environmental conditions of the second chamber are adjusted separately.

17. The method of claim 14, wherein the wafer transfer module and the die transfer module are disposed on two opposite sides of the wafer processing unit.

18. The method of claim 14, wherein the wafer transfer module and the die transfer module form a stack, and the stack is disposed adjacent to and in contact with the wafer processing unit.

19. The method of claim 14, further comprising:
transporting the second die carrier from the second bonding chamber to the second chamber after fusion bonding the second die to the wafer.

20. The method of claim 13, further comprising:
transporting the wafer bonded to the first die from the first bonding chamber to the first chamber; and
transporting the wafer bonded to the first die from the first chamber into the second bonding chamber.

\* \* \* \* \*